(12) United States Patent
Park et al.

(10) Patent No.: US 12,171,077 B2
(45) Date of Patent: Dec. 17, 2024

(54) ELECTRONIC DEVICE INCLUDING FLEXIBLE PRINTED CIRCUIT BOARD

(71) Applicant: Samsung Electronics Co., Ltd., Suwon-si (KR)

(72) Inventors: Jinwoo Park, Suwon-si (KR); Eunsoo Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 184 days.

(21) Appl. No.: 18/075,010

(22) Filed: Dec. 5, 2022

(65) Prior Publication Data

US 2023/0156944 A1    May 18, 2023

Related U.S. Application Data

(63) Continuation of application No. PCT/KR2022/013540, filed on Sep. 8, 2022.

(30) Foreign Application Priority Data

Nov. 12, 2021 (KR) .................. 10-2021-0156106
Dec. 8, 2021 (KR) .................. 10-2021-0174866

(51) Int. Cl.
H05K 5/02 (2006.01)
H05K 1/02 (2006.01)
H05K 5/06 (2006.01)

(52) U.S. Cl.
CPC ........... *H05K 5/0226* (2013.01); *H05K 1/028* (2013.01); *H05K 5/06* (2013.01)

(58) Field of Classification Search
CPC ......... H05K 5/0226; H05K 1/028; H05K 5/06
(Continued)

(56) References Cited

U.S. PATENT DOCUMENTS

| 8,089,003 | B2 | 1/2012 | Lee et al. | |
| 2018/0211091 | A1* | 7/2018 | Hsu | H05K 5/06 |
| 2020/0383225 | A1* | 12/2020 | Satou | H05K 5/06 |

FOREIGN PATENT DOCUMENTS

| JP | 3791510 B2 | 6/2006 |
| JP | 4258295 B2 | 4/2009 |

(Continued)

OTHER PUBLICATIONS

International Search Report dated Dec. 22, 2022, issued in the corresponding PCT application No. PCT/KR2022/013540.

*Primary Examiner* — Andargie M Aychillhum
(74) *Attorney, Agent, or Firm* — Jefferson IP Law, LLP

(57) ABSTRACT

An electronic device is provided. The electronic device includes a flexible printed circuit board (FPCB) is provided. The electronic device includes a display including a first area and a second area, a first housing supporting the first area, a second housing supporting the second area, a hinge structure connecting the first housing and the second housing to be foldable about a folding axis and allowing the first area and the second area to change between a first state of forming substantially the same plane and a second state of facing each other, a first bracket connecting the first housing and the hinge structure and having a first opening penetrating through a surface thereof, a second bracket connecting the second housing and the hinge structure and having a second opening penetrating through a surface thereof, and a FPCB extending from the first space to the second space across the hinge structure in an extending direction.

20 Claims, 19 Drawing Sheets

(58) Field of Classification Search
USPC .......................................................... 361/749
See application file for complete search history.

(56) References Cited

FOREIGN PATENT DOCUMENTS

| | | |
|---|---|---|
| JP | 2009-188488 A | 8/2009 |
| JP | 2011-009390 A | 1/2011 |
| JP | 2011-171635 A | 9/2011 |
| JP | 2016-040793 A | 3/2016 |
| JP | 2017-046089 A | 3/2017 |
| KR | 10-2008-010493 A | 12/2008 |
| KR | 10-2020-0057236 A | 5/2020 |
| KR | 10-2021-007824 A | 6/2021 |

* cited by examiner

ELECTRONIC DEVICE INCLUDING FLEXIBLE PRINTED CIRCUIT BOARD

CROSS-REFERENCE TO RELATED APPLICATION(S)

This application is a continuation application, claiming priority under § 365(c), of an International application No. PCT/KR2022/013540, filed on Sep. 8, 2022, which is based on and claims the benefit of a Korean patent application number 10-2021-0156106, filed on Nov. 12, 2021, in the Korean Intellectual Property Office, and of a Korean patent application number 10-2021-0174866, filed on Dec. 8, 2021, in the Korean Intellectual Property Office, the disclosure of each of which is incorporated by reference herein in its entirety.

BACKGROUND

1. Field

The disclosure relates to an electronic device including a flexible printed circuit board (FPCB).

2. Description of Related Art

Recently, electronic devices such as portable terminals have been developed to improve the convenience of use through miniaturization while having various functions to satisfy consumers' purchasing desires. Various components and boards for performing functions are mounted inside an electronic device, and these components may be connected through a flexible printed circuit board (FPCB).

The above information is presented as background information only to assist with an understanding of the disclosure. No determination has been made, and no assertion is made, as to whether any of the above might be applicable as prior art with regard to the disclosure.

SUMMARY

Electronic devices need to be miniaturized to improve portability and aesthetics. Various components are disposed inside an electronic device. Thus, technologies for effectively utilizing an internal space of a miniaturized electronic device are being developed. For example, a flexible printed circuit board (FPCB) for electrically connecting the components disposed at various positions may be disposed inside the electronic device.

Meanwhile, when the components inside the electronic device are connected through the FPCB, it is necessary to prevent moisture from entering through a path on which the FPCB is disposed.

Aspects of the disclosure are to address at least the above-mentioned problems and/or disadvantages and to provide at least the advantages described below. Accordingly, an aspect of the disclosure is to provide an electronic device including a FPCB.

- one aspect of the disclosure is to prevent moisture from entering a FPCB by applying a waterproof structure to the FPCB.
- one aspect of the disclosure is to form a FPCB in a multi-layer structure and improve the waterproof performance of the FPCB through an arrangement structure of multiple layers.

The technical goals to be achieved through embodiments of the disclosure are not limited to those described above, and other technical goals not mentioned above are clearly understood by one of ordinary skill in the art from the following description.

Additional aspects will be set forth in part in the description which follows and, in part, will be apparent from the description, or may be learned by practice of the presented embodiments.

In accordance with an aspect of the disclosure, an electronic device is provided. The electronic device includes a display including a first area and a second area, a first housing supporting the first area and forming a first space positioned on a rear surface of the first area, a second housing supporting the second area and forming a second space positioned on a rear surface of the second area, a hinge structure connecting the first housing and the second housing to be foldable about a folding axis and configured to change the first area and the second area between a first state of forming substantially the same plane and a second state of facing each other, a first bracket connecting the first housing and the hinge structure and having a first opening penetrating through a surface thereof, a second bracket connecting the second housing and the hinge structure and having a second opening penetrating through a surface thereof, and a FPCB extending from the first space to the second space across the hinge structure in an extending direction, and formed in a multi-layer structure in which a plurality of substrates having uneven surfaces according to metal patterns are stacked in a stacking direction, wherein the FPCB may include a first sealing portion positioned inside the first opening and a second sealing portion positioned inside the second opening, and a waterproof member for sealing a space between the plurality of substrates may be disposed in the first sealing portion and the second sealing portion.

In accordance with another aspect of the disclosure, a FPCB is provided. The FPCB includes a central portion, a first flexible portion connected to the central portion and configured to be partially bent. a second flexible portion connected to the central portion to be opposite to the first flexible portion and configured to be partially bent, a first sealing portion connected to the first flexible portion to be opposite to the central portion; a second sealing portion connected to the second flexible portion to be opposite to the central portion, a first extension portion connected to the first sealing portion to be opposite to the first flexible portion and configured to be partially bent, and a second extension portion connected to the second sealing portion to be opposite to the second flexible portion and configured to be partially bent, wherein the FPCB may be formed in a multi-layer structure in which a plurality of substrates having uneven surfaces according to metal patterns are stacked in a stacking direction, a stepped space by the uneven surfaces may be formed between the plurality of substrates, and a ratio of an area of the stepped space to a length of the first sealing portion and the second sealing portion may be less than or equal to a ratio of an area of the stepped space to a length of the first flexible portion and the second flexible portion.

In accordance with another aspect of the disclosure, an electronic device is provided. The electronic device includes a display including a first area and a second area, a first housing including a first surface on which the first area is disposed, and a second surface opposite to the first surface. a second housing including a third surface on which the second area is disposed, and a fourth surface opposite to the third surface, a hinge structure connecting the first housing and the second housing to be foldable about a folding axis and configured to change the first area and the second area between a first state of forming substantially the same plane and a second state of facing each other, a first bracket connecting the first housing and the hinge structure and including a first opening penetrating through a surface thereof, a second bracket connecting the second housing and the hinge structure and including a second opening penetrating through a surface thereof, a first printed circuit board (PCB) disposed between the first bracket and the second surface. a second PCB disposed between the second bracket and the fourth surface, a FPCB with at least a portion disposed between the hinge structure and the display, and both ends respectively connected to the first PCB and the second PCB by passing through the first opening and the second opening, a first sealing member surrounding a perimeter of a first sealing portion of the FPCB positioned inside the first opening, and sealing between the first opening and the first sealing portion, and a second sealing member surrounding a perimeter of a second sealing portion of the FPCB positioned inside the second opening, and sealing between the second opening and the second sealing portion, wherein the FPCB may be formed in a multi-layer structure in which a plurality of substrates having uneven surfaces according to metal patterns are stacked in a stacking direction, and a waterproof member for filling a stepped space formed by the uneven surfaces between the plurality of substrates may be disposed in the first sealing portion and the second sealing portion.

According to embodiments, it is possible to prevent moisture from entering a flexible printed circuit board (FPCB) by disposing a waterproof member in a sealing portion of the FPCB.

According to embodiments, it is possible to improve the service life of a FPCB by improving the bending performance of a portion of the FPCB adjacent to a sealing portion.

According to embodiments, it is possible to improve the waterproof performance inside an electronic device by sealing a space between an opening and a FPCB with a sealing member and sealing a space between layers of the FPCB with a waterproof member.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
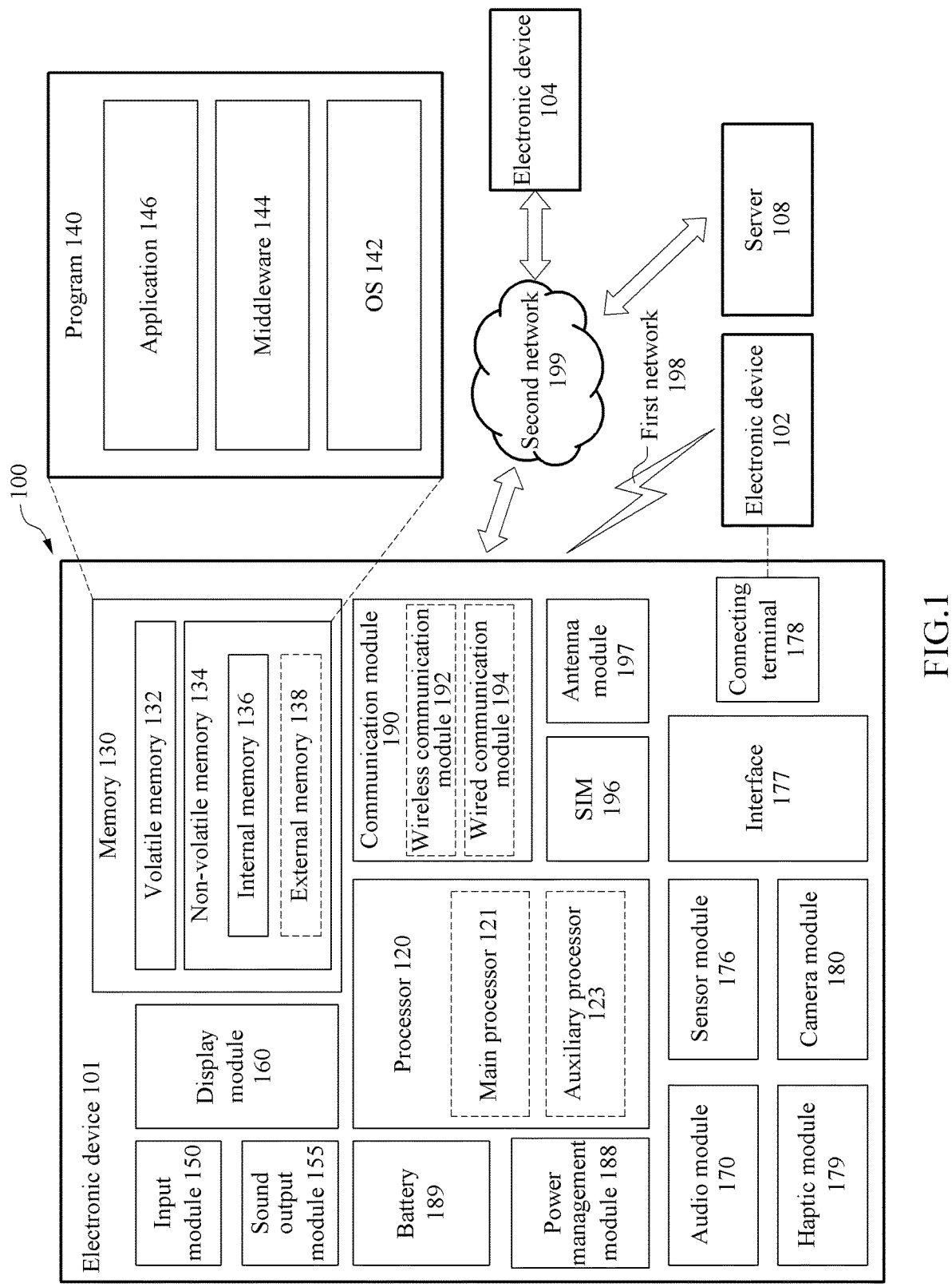
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to one embodiment, the electronic device 101 may communicate with the electronic device 104 via the server 108. According to one embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added in the electronic device 101. In some embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to one embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to one embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a portion of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to one embodiment, the auxiliary processor 123 (e.g., an ISP or a CP) may be implemented as a portion of another component (e.g., the camera module 180 or the communication module 190) that is functionally related to the auxiliary processor 123. According to one embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to one embodiment, the receiver may be implemented separately from the speaker or as a portion of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to one embodiment, the display module 160 may include a touch sensor adapted to sense a touch, or a pressure sensor adapted to measure an intensity of a force incurred by the touch.

The audio module 170 may convert a sound into an electrical signal or vice versa. According to one embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to one embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to one embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to one embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to one embodiment, the haptic module 179 may include, for example, a motor, a piezoelectric element, or an electric stimulator.

The camera module 180 may capture a still image and moving images. According to one embodiment, the camera module 180 may include one or more lenses, image sensors, ISPs, or flashes.

The power management module 188 may manage power supplied to the electronic device 101. According to one embodiment, the power management module 188 may be implemented as, for example, at least a portion of a power management integrated circuit (PMIC).

The battery 189 may supply power to at least one component of the electronic device 101. According to one embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to one embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to one embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to one embodiment, the antenna module 197 may include an antenna including a radiating element including a conductive material or a conductive pattern formed in or on a substrate (e.g., a printed circuit board (PCB)). According to one embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to one embodiment, another component (e.g., a radio frequency integrated circuit (RFIC)) other than the radiating element may be additionally formed as a portion of the antenna module 197.

According to one embodiment, the antenna module 197 may form a mmWave antenna module. According to one embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to one embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to one embodiment, all or some of operations to be executed by the electronic device 101 may be executed at one or more of the external electronic devices 102 or 104, or the server 108. For example, if the electronic device 101 needs to perform a function or a service automatically, or in response to a request from a user or another device, the electronic device 101, instead of, or in addition to, executing the function or the service, may request one or more external electronic devices to perform at least portion of the function or the service. The one or more external electronic devices receiving the request may perform the at least portion of the function or the service requested, or an additional function or an additional service related to the request, and may transfer an outcome of the performing to the electronic device 101. The electronic device 101 may provide the outcome, with or without further processing of the outcome, as at least portion of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In one embodiment, the external electronic device 104 may include an Internet-of-things (IoT) device. The server 108 may be an intelligent server using machine learning and/or a neural network. According to one embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to one embodiment may be one of various types of electronic devices. The electronic device may include, for example, a portable communication device (e.g., a smart phone), a computer device, a portable multimedia device, a portable medical device, a camera, a wearable device, or a home appliance device. According to one embodiment of the disclosure, the electronic device is not limited to those described above.

It should be appreciated that various embodiments of the disclosure and the terms used therein are not intended to limit the technological features set forth herein to particular embodiments and include various changes, equivalents, or replacements for a corresponding embodiment. In connection with the description of the drawings, like reference numerals may be used for similar or related components. As used herein, "A or B", "at least one of A and B", "at least one of A or B", "A, B or C", "at least one of A, B and C", and "at least one of A, B, or C", each of which may include any one of the items listed together in the corresponding one of the phrases, or all possible combinations thereof. Terms such as "first", "second", or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to one embodiment, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method according to one embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least portion of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities, and some of the multiple entities may be separately disposed in different components. According to one embodiment, one or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
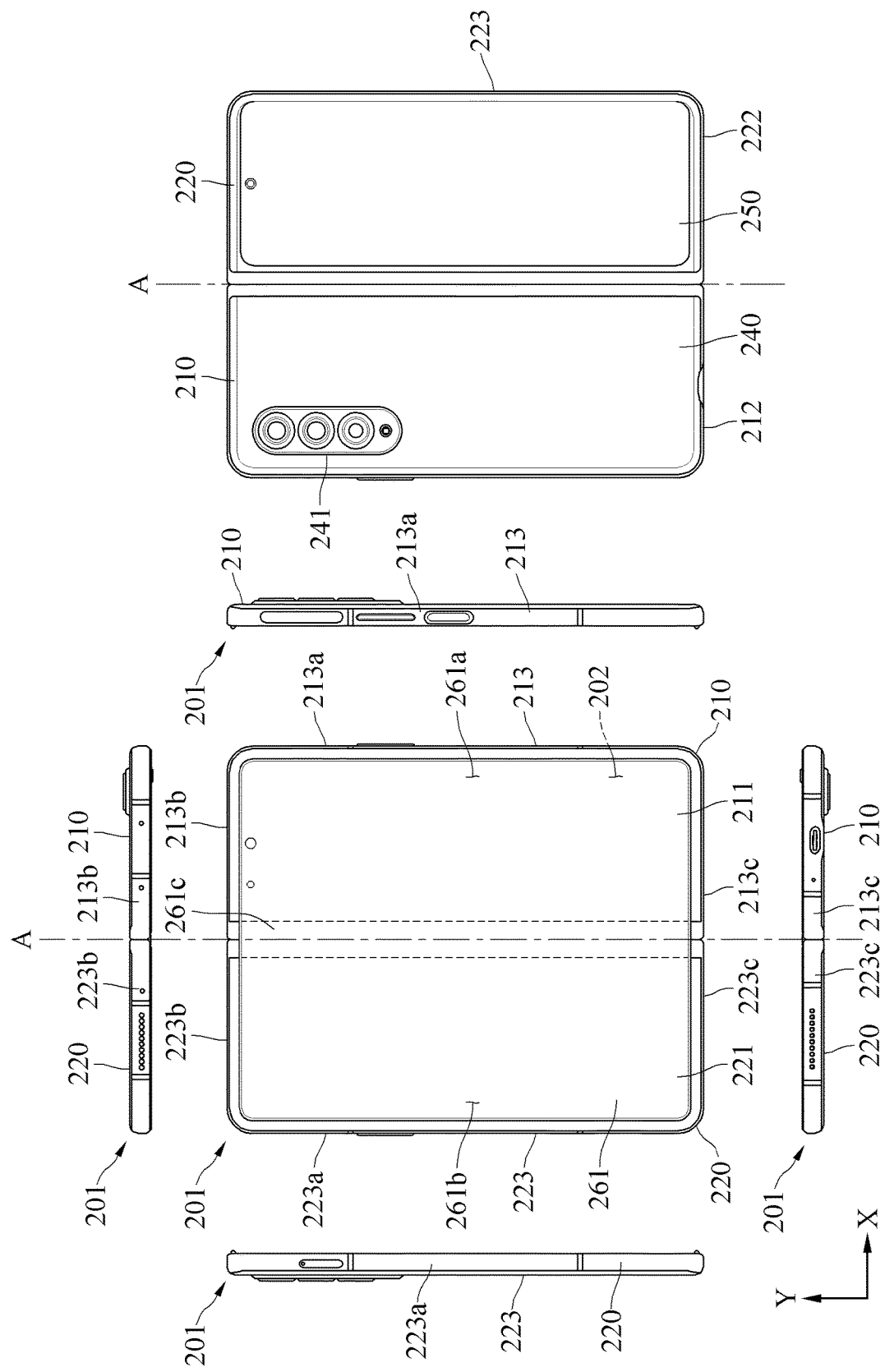
FIG. 2A is a view illustrating an unfolded state of an electronic device according to an embodiment of the disclosure.

FIG. 2A is a view illustrating an unfolded state of an electronic device according to an embodiment of the disclosure.

Figure 2B:
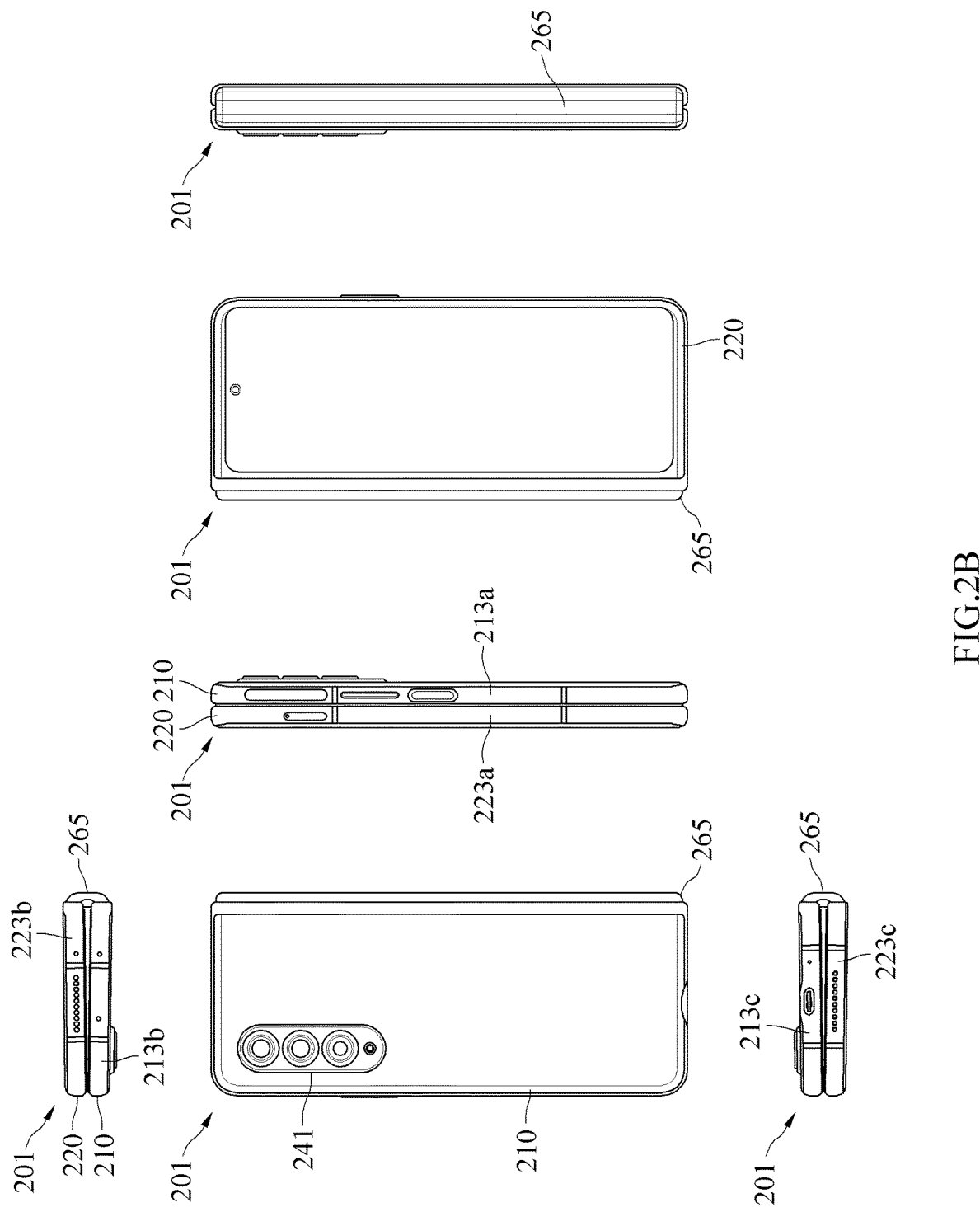
FIG. 2B is a view illustrating a folded state of an electronic device according to an embodiment of the disclosure.

FIG. 2B is a view illustrating a folded state of the electronic device according to an embodiment of the disclosure.

Figure 2C:
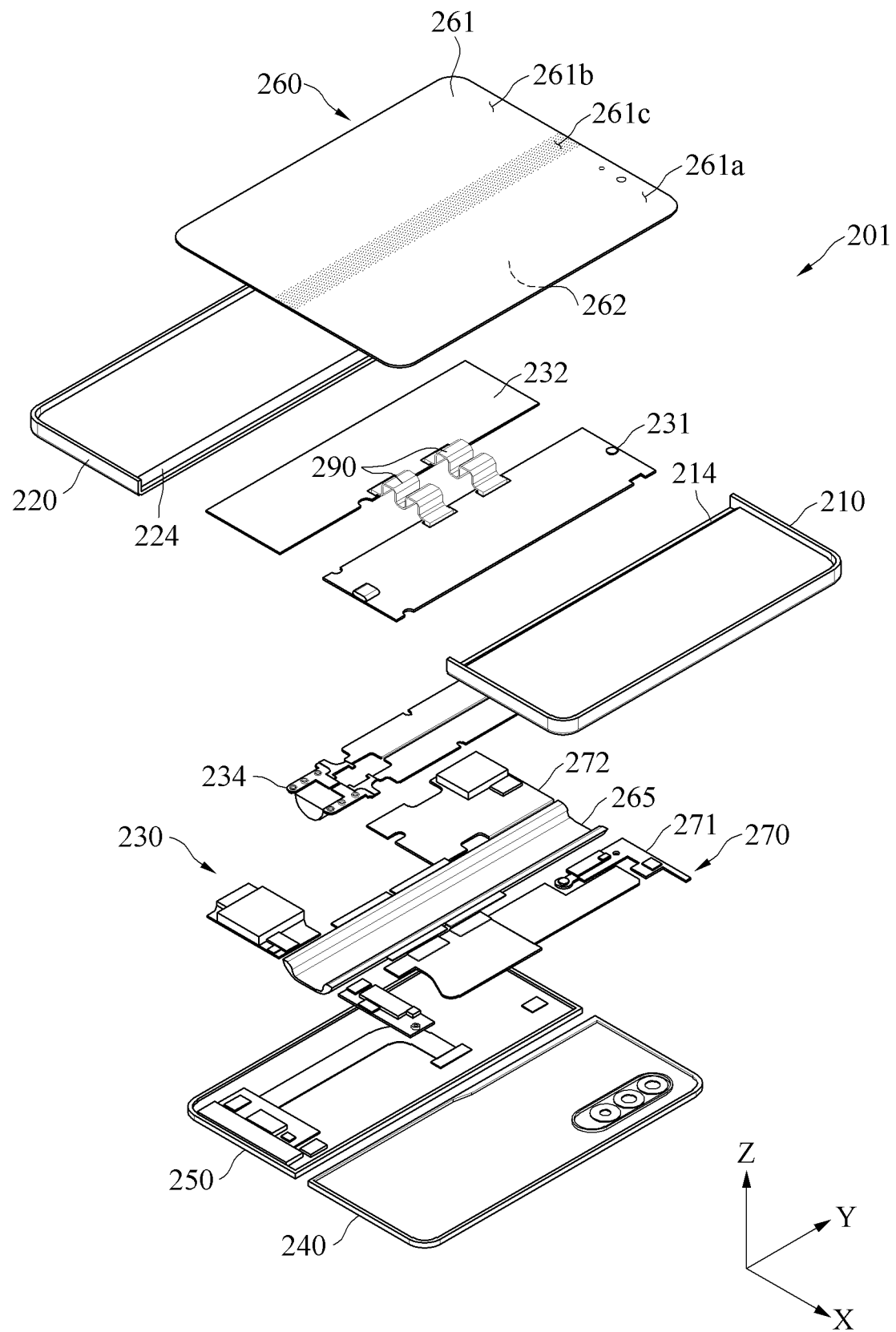
FIG. 2C is an exploded perspective view of an electronic device according to an embodiment of the disclosure.

FIG. 2C is an exploded perspective view of the electronic device according to an embodiment of the disclosure.

Referring to FIGS. 2A, 2B, and 2C, an electronic device 201 may include a pair of housings 210 and 220 rotatably coupled to each other through a hinge structure (e.g., a hinge structure 334 of FIG. 3A) to be folded with respect to each other, a hinge cover 265 for covering foldable portions of the pair of housings 210 and 220, and a display 261 (e.g., a flexible display or a foldable display) disposed in a space formed by the pair of housings 210 and 220. In the disclosure, a surface on which the display 261 is disposed may be defined as a front surface of the electronic device 201, and a surface opposite to the front surface may be defined as a rear surface of the electronic device 201. In addition, a surface surrounding a space between the front surface and the rear surface may be defined as a side surface of the electronic device 201.

In one embodiment, the pair of housings 210 and 220 may include a first housing 210, a second housing 220, a first rear cover 240, and a second rear cover 250. The pair of housings 210 and 220 of the electronic device 201 are not limited to the shapes or the combination and/or coupling of components shown in FIGS. 2A and 2B, and may be implemented in other shapes or by another combination and/or coupling of components.

In one embodiment, the first housing 210 and the second housing 220 may be disposed on both sides with respect to a folding axis A, and may be disposed substantially symmetrically with respect to the folding axis A. In one embodiment, an angle or a distance between the first housing 210 and the second housing 220 may vary depending on whether the electronic device 201 is in an unfolded state, a folded state, or an intermediate state. In one embodiment, the first housing 210 and the second housing 220 may have substantially symmetrical shapes.

Figure 3A:
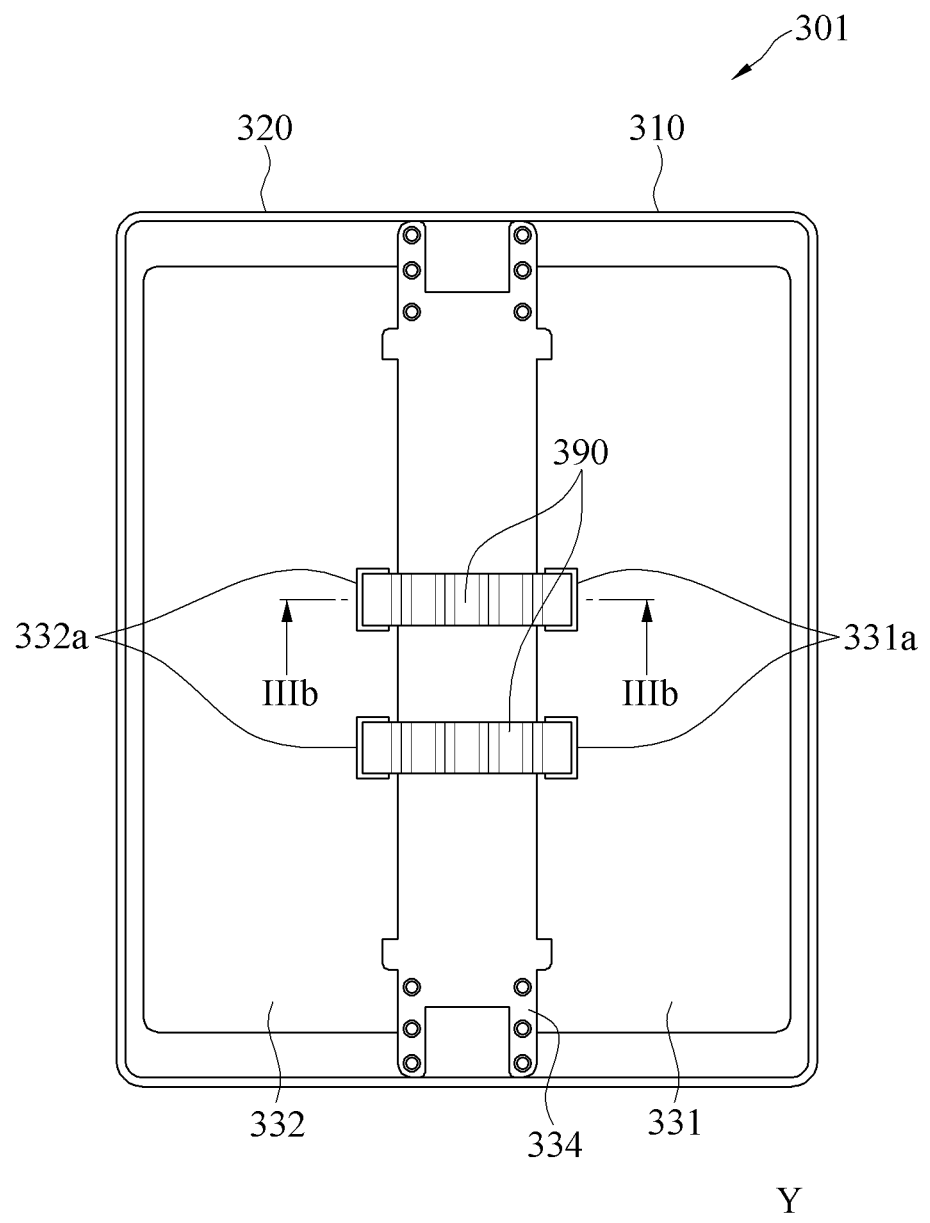
FIG. 3A is a view illustrating an arrangement of a flexible printed circuit board (FPCB) in an unfolded state of an electronic device according to an embodiment of the disclosure.

In one embodiment, the first housing 210 may be connected to a hinge structure (e.g., the hinge structure 334 of FIG. 3A). The first housing 210 may include a first surface 211 facing the front surface of the electronic device 201, a second surface 212 facing a direction opposite to the first surface 211, and a first side portion 213 enclosing at least a portion of a space between the first surface 211 and the second surface 212. The first side portion 213 may include a first side surface 213a disposed substantially in parallel with the folding axis A, a second side surface 213b extending in a direction substantially perpendicular to the folding axis A from one end of the first side surface 213a, and a third side surface 213c extending in a direction substantially perpendicular to the folding axis A from another end of the first side surface 213a and substantially parallel to the second side surface 213b. The second housing 220 may be connected to the hinge structure (e.g., the hinge structure 334 of FIG. 3A). The second housing 220 may include a third surface 221 facing the front surface of the electronic device 201, a fourth surface 222 facing a direction opposite to the third surface 221, and a second side portion 223 enclosing at least a portion of a space between the third surface 221 and the fourth surface 222. The second side member 223 may include a fourth side surface 223a disposed substantially in parallel with the folding axis A, a fifth side surface 223b extending in a direction substantially perpendicular to the folding axis A from one end of the fourth side surface 223a, and a sixth side surface 223c extending in a direction substantially perpendicular to the folding axis A from another end of the fourth side surface 223a and substantially parallel to the fifth side surface 223b. The first surface 211 and the third surface 221 may face each other when the electronic device 201 is in the folded state.

In one embodiment, the electronic device 201 may include at least one sound output module (e.g., the sound output module 155 of FIG. 1) disposed on the fifth side surface 223b and/or the sixth side surface 223c of the second housing 220.

In one embodiment, the electronic device 201 may include a recessed accommodating portion 202 for accommodating the display 261 through the structural coupling of the first housing 210 and the second housing 220. The accommodating portion 202 may have substantially the same size as the display 261.

In one embodiment, at least a portion of the first housing 210 and the second housing 220 may be formed of a metal material or a non-metal material having a predetermined magnitude of rigidity appropriate to support the display 261.

In one embodiment, the electronic device 201 may include at least one component disposed to be visually exposed on the front surface of the electronic device 201 to perform various functions. For example, the component may include at least one of a front camera module, a receiver, a proximity sensor, an illuminance sensor, an iris recognition sensor, an ultrasonic sensor, or an indicator. In one embodiment, the component included in the electronic device 201 may be disposed not to be visually exposed to the outside of the electronic device 201. For example, the at least one component may be disposed on a rear surface of the display 261. In one embodiment, the first rear cover 240 may be disposed on the second surface 212 of the first housing 210, and may have a substantially rectangular periphery. At least a portion of the periphery of the first rear cover 240 may be surrounded by the first housing 210. The second rear cover 250 may be disposed on the fourth surface 222 of the second housing 220, and may have a substantially rectangular periphery. At least a portion of the periphery of the second rear cover 250 may be surrounded by the second housing 220.

In one embodiment, the first rear cover 240 and the second rear cover 250 may have substantially symmetrical shapes with respect to the folding axis A. In one embodiment, the first rear cover 240 and the second rear cover 250 may have different shapes. In one embodiment, the first housing 210 and the first rear cover 240 may be integrally formed, and the second housing 220 and the second rear cover 250 may be integrally formed.

In one embodiment, the first housing 210, the second housing 220, the first rear cover 240, and the second rear cover 250 may provide a space in which various components (e.g., a PCB, the antenna module 197 of FIG. 1, the sensor module 176 of FIG. 1, or the battery 189 of FIG. 1) of the electronic device 201 may be arranged through a structure in which the first housing 210, the second housing 220, the first rear cover 240, and the second rear cover 250 are coupled to one another. In one embodiment, at least one component may be visually exposed on the rear surface of the electronic device 201. For example, at least one component may be visually exposed through a first rear area 241 of the first rear cover 240. Here, the component may include a proximity sensor, a rear camera module, and/or a flash.

In one embodiment, the display 261 may be disposed in the accommodating portion 202 formed by the pair of housings 210 and 220. For example, the display 261 may be arranged to occupy substantially most of the front surface of the electronic device 201. The front surface of the electronic device 201 may include an area in which the display 261 is disposed, and a partial area (e.g., a periphery area) of the first housing 210 and a partial area (e.g., a periphery area) of the second housing 220, which are adjacent to the display 261. The rear surface of the electronic device 201 may include the first rear cover 240, a partial area (e.g., a periphery area) of the first housing 210 adjacent to the first rear cover 240, the second rear cover 250, and a partial area (e.g., a periphery area) of the second housing 220 adjacent to the second rear cover 250. In one embodiment, the display 261 may be a display in which at least one area is deformable into a planar surface or a curved surface. In one embodiment, the display 261 may include a flexible area 261c, a first area 261a on a first side (e.g., the right side) of the flexible area 261c, and a second area 261b on a second side (e.g., the left side) of the flexible area 261c. For example, the first area 261a may be positioned on the first surface 211 of the first housing 210, and the second area 261b may be positioned on the third surface 221 of the second housing 220. However, the area division of the display 261 is merely an example, and the display 261 may be divided into a plurality of areas depending on the structure or functions of the display 261. For example, as shown in FIG. 2A, the display 261 may be divided into areas based on the folding axis A or the flexible area 261c extending in parallel to a Y-axis, or the display 261 may be divided into areas based on another folding area (e.g., a folding area extending in parallel to an X-axis) or another folding axis (e.g., a folding axis parallel to the X-axis). The area division of the display 261 as above is merely physical division based on the pair of housings 210 and 220 and the hinge structure (e.g., the hinge structure 334 of FIG. 3A), and the display 261 may display substantially one screen through the pair of housings 210 and 220 and the hinge structure (e.g., the hinge structure 334 of FIG. 3A). In one embodiment, the first area 261a and the second area 261b may have substantially symmetrical shapes with respect to the flexible area 261c.

In one embodiment, the hinge cover 265 may be disposed between the first housing 210 and the second housing 220 and configured to cover the hinge structure (e.g., the hinge structure 334 of FIG. 3A). The hinge cover 265 may be hidden by at least a portion of the first housing 210 and the second housing 220 or exposed to the outside according to the operating state of the electronic device 201. For example, when the electronic device 201 is in an unfolded state as shown in FIG. 2A, the hinge cover 265 may be hidden by the first housing 210 and the second housing 220 and not exposed to the outside, and when the electronic device 201 is in a folded state as shown in FIG. 2B, the hinge cover 265 may be exposed to the outside between the first housing 210 and the second housing 220. Meanwhile, when the electronic device 201 is in an intermediate state in which the first housing 210 and the second housing 220 form an angle with each other, at least a portion of the hinge cover 265 may be exposed to the outside between the first housing 210 and the second housing 220. In this case, an area of the hinge cover 265 exposed to the outside may be smaller than the area of the hinge cover 265 exposed when the electronic device 201 is in the folded state. In one embodiment, the hinge cover 265 may have curved surfaces.

Describing the operation of the electronic device 201 according to one embodiment, when the electronic device 201 is in an unfolded state (e.g., the state of the electronic device 201 of FIG. 2A), the first housing 210 and the second housing 220 may form a first angle (e.g., about 180 degrees) with each other, and the first area 261a and the second area 261b of the display 261 may be oriented in substantially the same direction. The flexible area 261c of the display 261 may be on substantially the same plane as the first area 261a and the second area 261b. In one embodiment, when the electronic device 201 is in the unfolded state, the first housing 210 may rotate at a second angle (e.g., about 360 degrees) relative to the second housing 220, whereby the first housing 210 and the second housing 220 may be reversely folded such that the second surface 212 and the fourth surface 222 may face each other. Meanwhile, when the electronic device 201 is in the folded state (e.g., the state of the electronic device 201 of FIG. 2B), the first housing 210 and the second housing 220 may face each other. The first housing 210 and the second housing 220 may form an angle of about 0 degrees to about 10 degrees, and the first area 261a and the second area 261b of the display 261 may face each other. At least a portion of the flexible area 261c of the display 261 may be deformed into a curved surface. Meanwhile, when the electronic device 201 is in the intermediate state, the first housing 210 and the second housing 220 may form a predetermined angle with each other. An angle (e.g., a third angle, about 90 degrees) formed by the first area 261a and the second area 261b of the display 261 may be greater than that when the electronic device 201 is in the folded state and less than that when the electronic device 201 is in the unfolded state. At least a portion of the flexible area 261c of the display 261 may be deformed into a curved surface. In this case, a curvature of the curved surface of the flexible area 261c may be smaller than that when the electronic device 201 is in the folded state.

In one embodiment, the electronic device 201 may be folded about the folding axis A by means of a hinge structure (e.g., the hinge structure 334 of FIGS. 3A to 3D). For example, it is shown in the drawings that the folding axis A is formed by the hinge structure in a vertical direction (e.g., the Y-axis direction) of the electronic device 201 for ease of description, but this is merely an example, and the direction in which the axis A is formed is not limited thereto. For example, the folding axis A may be formed by the hinge structure in a horizontal direction (e.g., the X-axis direction) of the electronic device 201, or a plurality of folding axes may be formed all in the same direction or in different directions such that the electronic device 201 may be folded a plurality of times through the plurality of folding axes. Meanwhile, the various embodiments of the electronic device described herein are not limited to the form factor of the electronic device 201 described with reference to FIGS. 2A and 2B, and may also apply to electronic devices with various form factors.

Referring to FIG. 2C, an electronic device 201 according to one embodiment may include a display module 260 (e.g., the display module 160 of FIG. 1), a hinge assembly 230, a substrate 270, a first housing 210 (e.g., the first housing 210 of FIGS. 2A and 2B), the second housing 220 (e.g., the second housing 220 of FIGS. 2A and 2B), the first rear cover 240 (e.g., the first rear cover 240 of FIGS. 2A and 2B), and the second rear cover 250 (e.g., the second rear cover 250 of FIGS. 2A and 2B).

The display module 260 may include a display 261 (e.g., the display 261 of FIGS. 2A and 2B) and at least one layer or plate 262 on which the display 261 is seated. In one embodiment, the plate 262 may be disposed between the display 261 and the hinge assembly 230. The display 261 may be disposed on at least a portion of one surface (e.g., a top surface) of the plate 262. The plate 262 may be formed in a shape corresponding to the display 261.

In one embodiment, the display 261 may include a flexible display substrate, a plurality of display elements coupled to the display substrate to form multiple pixels, one or more conductive lines coupled to the display substrate and electrically connected to other display elements, and a thin-film encapsulation layer configured to prevent an inflow of external oxygen and moisture. In one embodiment, the display 261 may include a touch panel or may be integrally formed therewith.

The display substrate may be formed of a flexible material, for example, a plastic material such as polyimide (PI), but the material of the display substrate is not limited thereto and may include various materials having flexible properties. The plurality of display elements may be arranged on the display substrate and form multiple pixels. For example, the plurality of display elements may be arranged in a matrix form on the display substrate to form pixels of the display 261. In this case, the plurality of display elements may include a fluorescent material or an organic fluorescent material capable of expressing colors. For example, the display elements may include organic light emitting diodes (OLEDs). The conductive lines may include one or more gate signal lines or one or more data signal lines. For example, the conductive lines may include a plurality of gate signal lines and a plurality of data signal lines, and the plurality of gate signal lines and the plurality of data signal lines may be arranged in a matrix form. In this case, the plurality of display elements may be arranged adjacent to a point where a plurality of lines intersect, and may be electrically connected to each line. The thin film encapsulation layer may cover the display substrate, the plurality of display elements, and the conductive lines, thereby preventing an inflow of oxygen and moisture from an outside. In one embodiment, the thin film encapsulation layer may be formed by alternately stacking one or more organic film layers and one or more inorganic film layers.

In one embodiment, the touch panel may be formed as an integral body on the display substrate or attached thereto. For example, the touch panel may be formed by patterning an aluminum metal mesh sensor on the thin film encapsulation layer.

In one embodiment, the polarizing film may be stacked between the display substrate and the touch panel. The polarizing film may improve visibility of the display 261. The polarizing film may change a phase of light passing through the display 261. For example, the polarizing film may convert linearly polarized light into circularly polarized light or convert circularly polarized light into linearly polarized light, thereby preventing reflection of light incident to the display 261.

The window layer may be formed of a transparent plastic film having high flexibility and high hardness. For example, the window layer may be formed of a polyimide (PI) or polyethylene terephthalate (PET) film. In one embodiment, the window layer may be formed as multiple layers including a plurality of plastic films.

In one embodiment, the plate 262 may support the rear surface of the display 261, thereby improving the impact resistance of the display 261. In one embodiment, the plate 262 may be divided into areas to support a rear surface of the first area 261a and a rear surface of the second area 261b of the display 261, respectively. In this case, the respective areas of the plate 262 may be separately attached to the rear surface of the first area 261a and the rear surface of the second area 261b of the display 261 so as not to contact each other along the folding axis A. According to this structure, the plate 262 may not interfere with the folding operation of the display 261 performed along the folding axis A.

In one embodiment, the plate 262 may be formed of a conductive material, for example, copper or an alloy material including copper. In this case, the plate 262 may function as a heat transfer path that transfers heat generated in an internal component (e.g., an application processor (AP)) in the electronic device to the display panel 261, at the same time improving the impact resistance of the display 261.

The hinge assembly 230 may include a first bracket 231, a second bracket 232, a hinge structure 234 disposed between the first bracket 231 and the second bracket 232, a hinge cover 265 for covering the hinge structure 234 when the hinge structure 234 is viewed from the outside, and a FPCB 290 that traverses the first bracket 231 and the second bracket 232. In one embodiment, the FPCB 290 may be a flexible printed circuit board (FPCB).

In one embodiment, the hinge assembly 230 may be disposed between the plate 262 and the substrate 270. For example, the first bracket 231 may be disposed between the first area 261a of the display 261 and a first PCB 271. The second bracket 232 may be disposed between the second area 261b of the display 261 and a second PCB 272.

In one embodiment, at least a portion of the hinge structure 234 and the FPCB 290 may be disposed inside the hinge assembly 230. The FPCB 290 may be disposed in a direction (e.g., the X-axis direction) that traverses the first bracket 231 and the second bracket 232. The FPCB 290 may be disposed in a direction (e.g., the X-axis direction) perpendicular to a folding axis (e.g., the Y-axis or the folding axis A of FIG. 2A) of the flexible area 261c of the electronic device 201.

The substrate 270 may include the first PCB 271 disposed on the first bracket 231 and the second PCB 272 disposed on the second bracket 232. The first PCB 271 and the second PCB 272 may be disposed in a space formed by the hinge assembly 230, the first housing 210, the second housing 220, the first rear cover 240, and the second rear cover 250. For example, the first PCB 271 may be disposed inside the first housing 210, and the second PCB 272 may be disposed inside the second housing 220. In this case, the first PCB 271 may be disposed between the first bracket 231 and the second surface 212 of the first housing 210, and the second PCB 272 may be disposed between the second bracket 232 and the fourth surface 222 of the second housing 220. Components for implementing various functions of the electronic device 201 may be disposed on the first PCB 271 and the second PCB 272.

The first housing 210 and the second housing 220 may be assembled together to be coupled to both sides of the hinge assembly 230 in a state in which the display module 260 is coupled to the hinge assembly 230. The first housing 210 and the second housing 220 may be respectively connected to both sides of the hinge assembly 230.

In one embodiment, the first housing 210 may include a first rotation support surface 214, and the second housing 220 may include a second rotation support surface 224 corresponding to the first rotation support surface 214. The first rotation support surface 214 and the second rotation support surface 224 may include curved surfaces corresponding to the curved surfaces included in the hinge cover 265.

In one embodiment, when the electronic device 201 is in an unfolded state (e.g., the electronic device 201 of FIG. 2A), the first rotation support surface 214 and the second rotation support surface 224 may cover the hinge cover 265 such that the hinge cover 265 may not be exposed through the rear surface of the electronic device 201 or may be minimally exposed. Meanwhile, when the electronic device 201 is in a folded state (e.g., the electronic device 201 of FIG. 2B), the first rotation support surface 214 and the second rotation support surface 224 may rotate along the curved surfaces included in the hinge cover 265 such that the hinge cover 265 may be maximally exposed through the rear surface of the electronic device 201.

FIG. 3A is a view illustrating an arrangement of a FPCB in an unfolded state of an electronic device according to an embodiment of the disclosure.

Figure 3B:
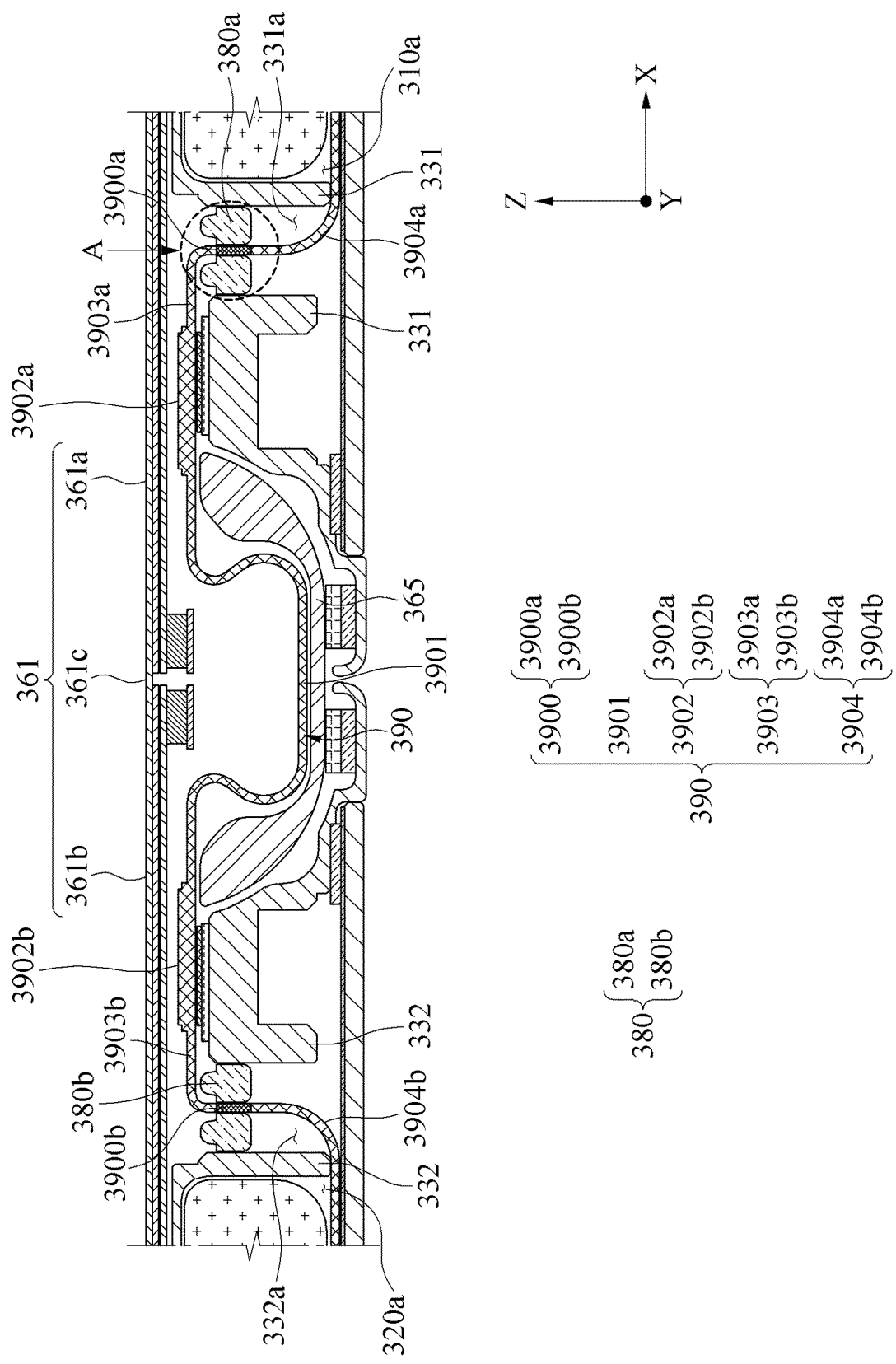
FIG. 3B is a cross-sectional view of the electronic device according to a line of FIG. 3A according to an embodiment of the disclosure.

FIG. 3B is a cross-sectional view of the electronic device according to a line of FIG. 3A according to an embodiment of the disclosure.

Figure 3C:
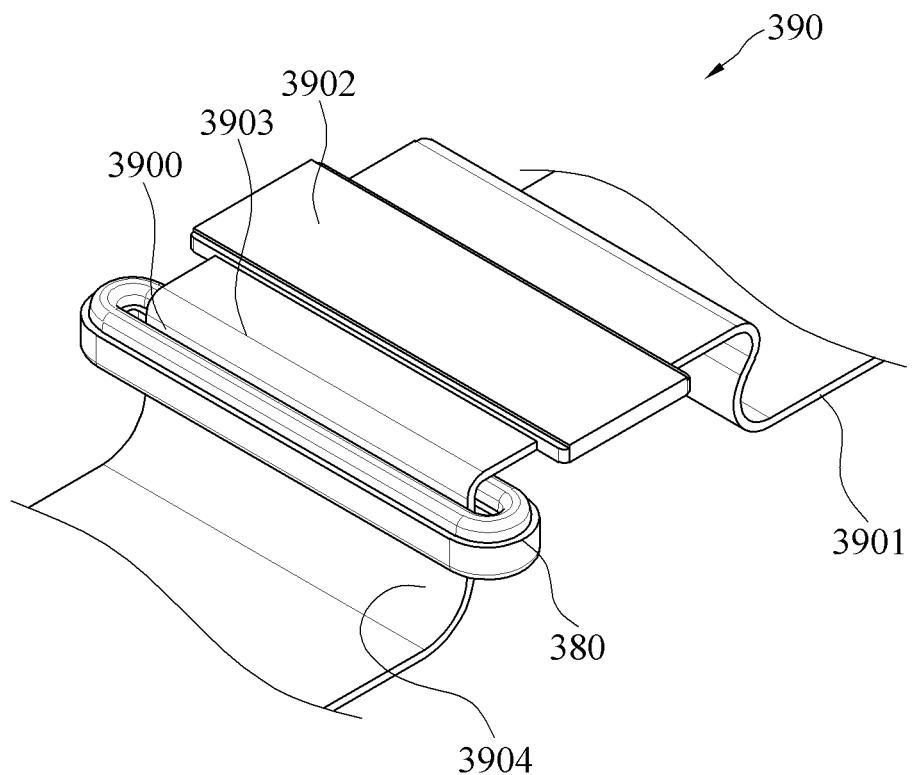
FIG. 3C is a partial perspective view illustrating a coupling state of a FPCB and a sealing member according to an embodiment of the disclosure.

FIG. 3C is a partial perspective view illustrating a coupling state of the FPCB and a sealing member according to an embodiment of the disclosure.

Figure 3D:
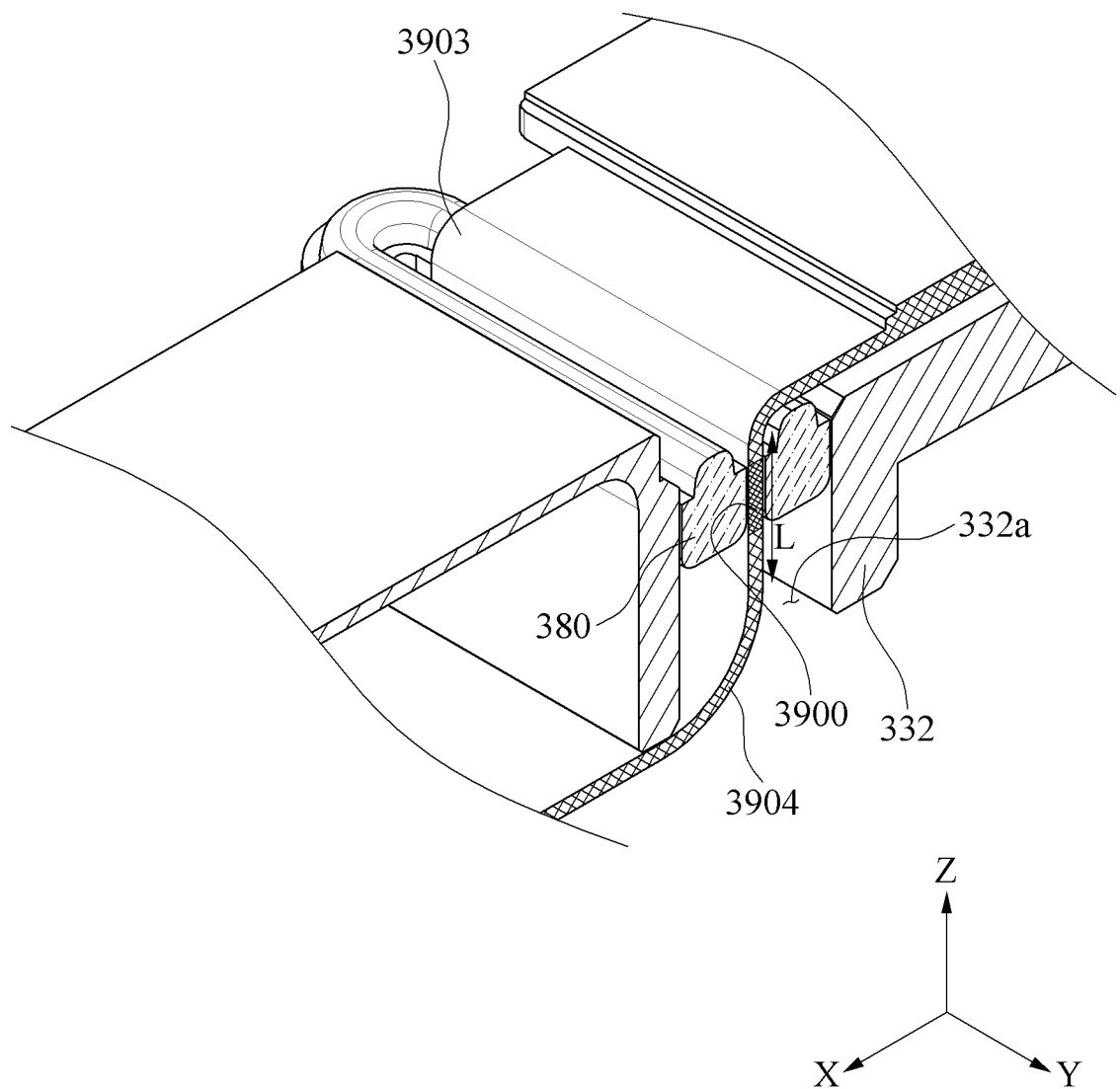
FIG. 3D is a cross-sectional view illustrating an area A of FIG. 3B according to an embodiment of the disclosure.

FIG. 3D is a cross-sectional view illustrating an area A of FIG. 3B according to an embodiment of the disclosure.

Referring to FIGS. 3A to 3D, an electronic device 301 (e.g., the electronic device 101 of FIG. 1 or the electronic device 201 of FIG. 2A) according to one embodiment may include a display 361, a first housing 310, a second housing 320, a hinge structure 334, a first bracket 331, a second bracket 332, a FPCB 390, a first sealing member 380a, and a second sealing member 380b.

In one embodiment, the display 361 may include a first area 361a, a second area 361b, and a folding area 361c connecting the first area 361a and the second area 361b.

In one embodiment, the first housing 310 may support the first area 361a and form a first space 310a positioned on a rear surface of the first area 361a. In one embodiment, the second housing 320 may support the second area 361b and form a second space 320a positioned on a rear surface of the second area 361b. In one embodiment, a first PCB (e.g., the first PCB 271 of FIG. 2C) may be disposed in the first space 310a formed by the first housing 310, and a second PCB (e.g., the second PCB 272 of FIG. 2C) may be disposed in the second space 320a formed by the second housing 320. In one embodiment, the hinge structure 334 may rotatably connect the first housing 310 and the second housing 320 about a folding axis. In one embodiment, the hinge structure 334 may include a hinge cover 365 disposed between the first housing 310 and the second housing 320. In one embodiment, the hinge structure 334 may allow the first area 361a and the second area 361b of the display 361 to change between a first state (e.g., the unfolded state of FIG. 2A) of forming substantially the same plane and a second state (e.g., the folded state of FIG. 2B) of facing each other, through the folding operation of the first housing 310 and the second housing 320.

In one embodiment, the first bracket 331 and the second bracket 332 may be rotatably connected to the hinge structure 334. In one embodiment, the first bracket 331 may be disposed inside the first space 310a and connect the first housing 310 and the hinge structure 334. In one embodiment, the second bracket 332 may be disposed inside the second space 320a and connect the second housing 320 and the hinge structure 334. In this case, the first bracket 331 may be disposed between the first area 361a and the first PCB (e.g., the first PCB 271 of FIG. 2C), and the second bracket 332 may be disposed between the second area 361b and the second PCB (e.g., the second PCB 272 of FIG. 2C).

In one embodiment, the first bracket 331 and the second bracket 332 may have openings 331a and 332a penetrating through surfaces thereof, respectively. For example, the first bracket 331 may have one or more first openings 331a formed to penetrate therethrough toward the first area 361a, and the second bracket 332 may have one or more second openings 332a formed to penetrate therethrough toward the second area 361b. In one embodiment, the FPCB 390 may extend to the first space 310a and the second space 320a through the first opening 331a and the second opening 332a.

In one embodiment, the FPCB 390 may electrically connect the component elements inside the electronic device 301. In one embodiment, the FPCB 390 may have a longitudinal direction to extend from the first space 310a through the hinge structure 334 to the second space 320a along an extending direction. In this case, at least a portion of the FPCB 390 may be disposed between the hinge structure 334 and the display 361, and both ends of the FPCB 390 may pass through the first opening 331a and the second opening 332a and extend to the first space 310a and the second space 320a, respectively. For example, both ends of the FPCB 390 may be connected to the first PCB (e.g., the first PCB 271 of FIG. 2C) disposed in the first space 310a and the second PCB (e.g., the second PCB 272 of FIG. 2C) disposed in the second space 320a.

In one embodiment, the FPCB 390 may include a central portion 3901, a first flexible portion 3903a, a second flexible portion 3903b, a first sealing portion 3900a, a second sealing portion 3900b, a first extension portion 3904a, and a second extension portion 3904b. In one embodiment, at least a portion of the central portion 3901 may be disposed between the hinge structure 334 and the display 361. For example, the central portion 3901 may be disposed in an inner space of the hinge cover 365, and both ends thereof may extend in the direction of the first bracket 331 and in the direction of the second bracket 332, respectively. In one embodiment, the first flexible portion 3903a may be connected to the central portion 3901 and extend to the first opening 331a. In this case, the first flexible portion 3903a may be formed to be partially bent. In one embodiment, the second flexible portion 3903b may be connected to the central portion 3901 to be opposite to the first flexible portion 3903a, and extend to the second opening 332a. In this case, the second flexible portion 3903b may be formed to be partially bent. In one embodiment, a rigid portion 3902 may be formed between the central portion 3901 and the flexible portion 3903. For example, a first rigid portion 3902a may be formed between the central portion 3901 and the first flexible portion 3903a, and a second rigid portion 3902b may be formed between the central portion 3901 and the second flexible portion 3903b.

In one embodiment, the first sealing portion 3900a may be connected to the first flexible portion 3903a to be opposite to the central portion 3901, and the second sealing portion 3900b may be connected to the second flexible portion 3903b to be opposite to the central portion 3901. In this case, the first sealing portion 3900a may be disposed inside the first opening 331a, and the second sealing portion 3900b may be disposed inside the second opening 332a. In one embodiment, the first extension portion 3904a may be connected to the first sealing portion 3900a to be opposite to the first flexible portion 3903a. The first extension portion 3904a may extend from the first opening 331a toward the first space 310a. In this case, the first extension portion 3904a may be formed to be partially bent. In one embodiment, the second extension portion 3904b may be connected to the second sealing portion 3900b to be opposite to the second flexible portion 3903b, and extend from the second opening 332a toward the second space 320a. In this case, the second extension portion 3904b may extend from the second opening 332a toward the second space 320a.

In one embodiment, the first sealing member 380a may seal the first opening 331a, and the second sealing member 380b may seal the second opening 332a. In one embodiment, the first sealing member 380a may be inserted and fixed into the first opening 331a, and the second sealing member 380b may be inserted and fixed into the second opening 332a. In this case, in a state in which the FPCB 390 is disposed to pass through the first opening 331a and the second opening 332a, the first sealing member 380a may seal a space between the first opening 331a and the first sealing portion 3900a, and the second sealing member 380b may seal a space between the second opening 332a and the second sealing portion 3900b. In one embodiment, based on a state in which the first opening 331a and the second opening 332a are viewed in the direction of the display 361, the first sealing member 380a may be formed in a shape corresponding to the first opening 331a, and the second sealing member 380b may be formed in a shape corresponding to the second opening 332a. In this case, the first sealing member 380a may be connected to surround a perimeter of the first sealing portion 3900a, and the second sealing member 380b may be connected to surround a perimeter of the second sealing portion 3900b. In one embodiment, the first sealing member 380a and the second sealing member 380b may be formed of a compressible elastic material. In this case, in a state in which the first sealing member 380a and the second sealing member 380b are positioned in the first opening 331a and the second opening 332a, respectively, the first sealing member 380a and the second sealing member 380b may compress the surface of the first sealing portion 3900a and the surface of the second sealing portion 3900b, respectively, thereby preventing moisture from entering along the surface of the FPCB 390. Meanwhile, a drawing (e.g., FIG. 3C) illustrates the first sealing member 380a and the second sealing member 380b as a single structure including an insertion hole into which the FPCB 390 is inserted, which, however, is only for ease of description. The shapes and structure of the first sealing member 380a and the second sealing member 380b are not limited thereto. For example, the first sealing member 380a and the second sealing member 380b may be elastic glue applied to the surface of the first sealing portion 3900a and the surface of the second sealing portion 3900b to seal the space between the FPCB 390 and the openings, or various known waterproof packing structures. In other words, various structures capable of sealing the space between the openings and the FPCB to prevent moisture from entering through the openings may be applied to the first sealing member 380a and the second sealing member 380b.

In one embodiment, the FPCB 390 may extend from the first space 310a inside the first housing 310 to the second space 320a inside the second housing 320 as shown in FIG. 3C. In this case, since the FPCB 390 extends through the first opening 331a and the second opening 332a, the first sealing member 380a and the second sealing member 380b may seal the first opening 331a and the second opening 332a, thereby preventing moisture from entering the first space 310a and the second space 320a along the surface of the FPCB 390. In one embodiment, the FPCB 390 may include a waterproof structure formed therein, thereby preventing moisture from entering the first space 310a and the second space 320a therethrough. Hereinafter, for ease of description, an internal waterproof structure of the FPCB 390 will be described based on the first sealing portion 3900a of the FPCB 390. In addition, unless otherwise mentioned, a sealing portion 3900 may be construed as a collective term for the first sealing portion 3900a and the second sealing portion 3900b, a sealing member 380 may be construed as a collective term for the first sealing member 380a and the second sealing member 380b, and an opening 331a, 332a may be construed as a collective term for the first opening 331a and the second opening 332a.

Figure 4A:
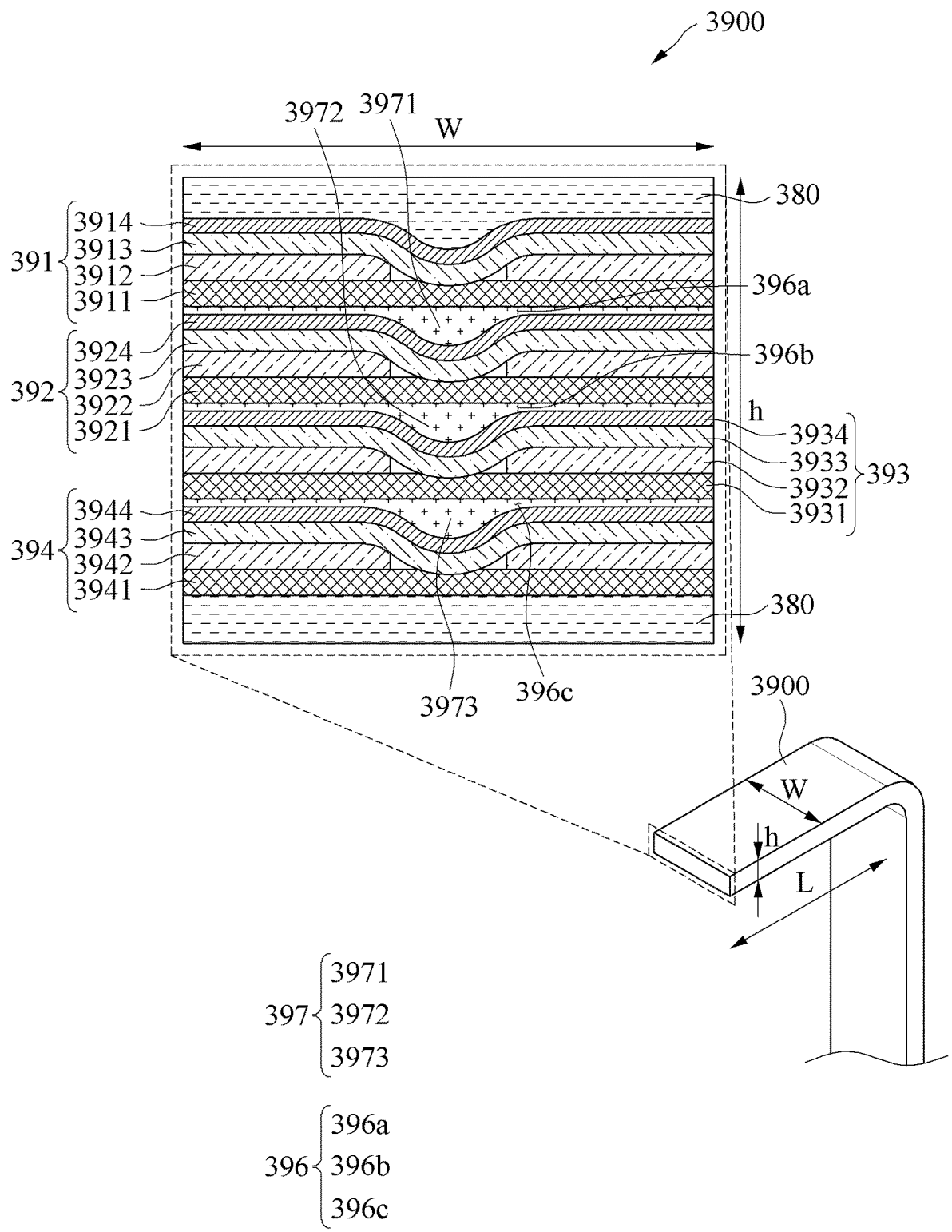
FIGS. 4A, 4B, and 4C are cross-sectional views illustrating a sealing portion of a FPCB according to various embodiments of the disclosure.
Figure 4B:
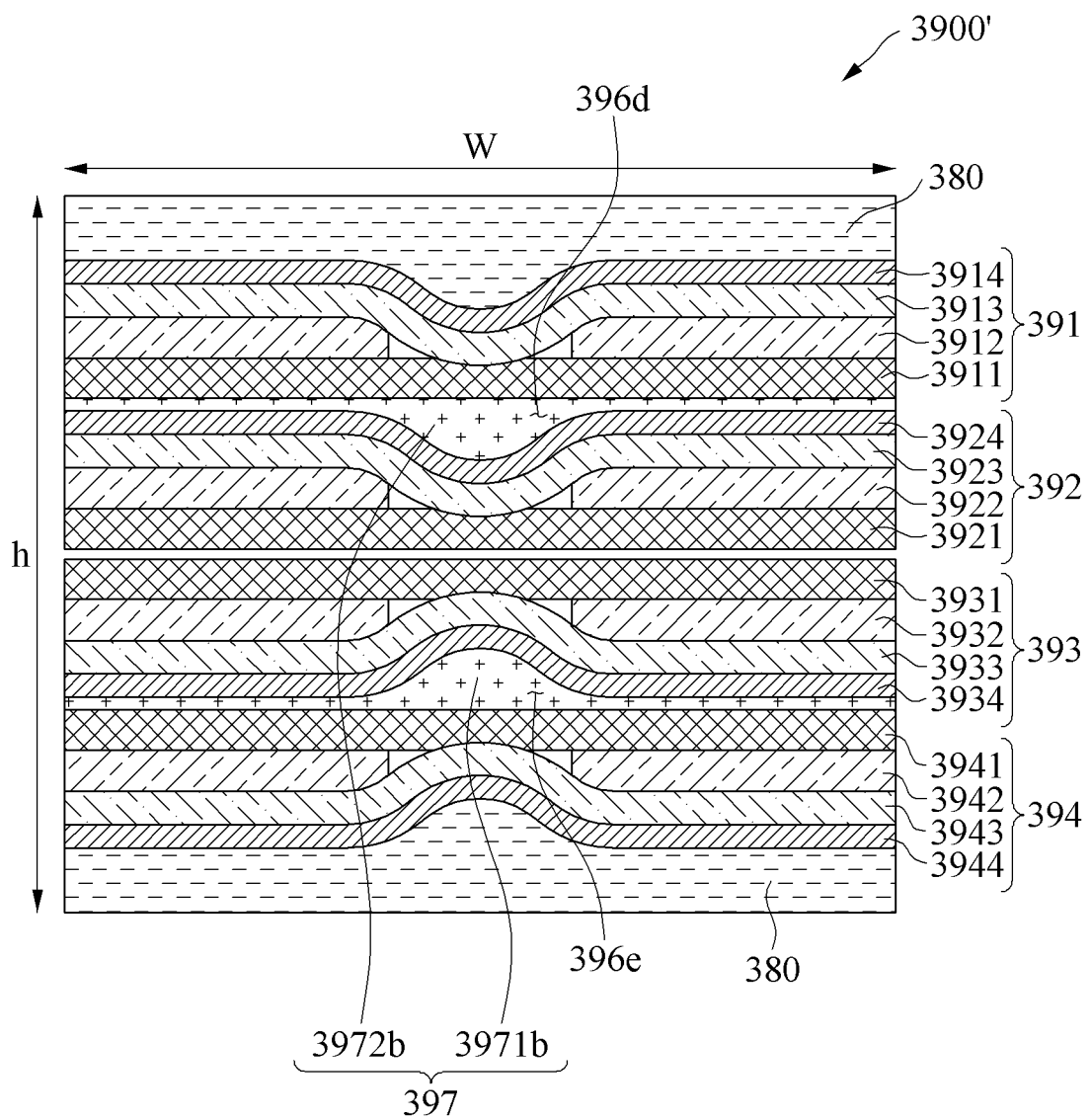
Figure 4C:
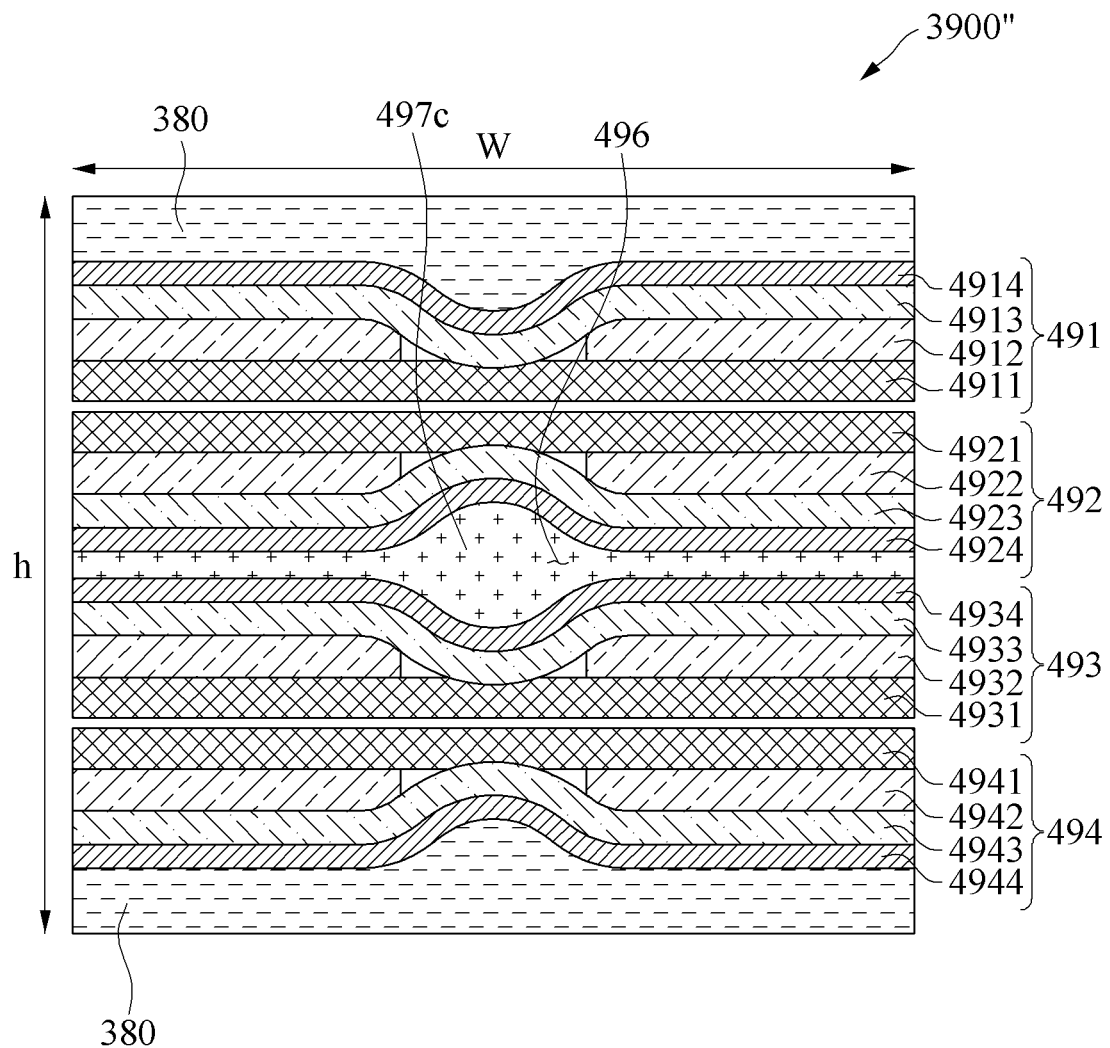

FIGS. 4A, 4B, and 4C are cross-sectional views illustrating a sealing portion of a FPCB according to various embodiments of the disclosure.

Referring to FIGS. 4A to 4C, a FPCB (e.g., the FPCB 390 of FIG. 3B) according to one embodiment may include a plurality of substrates 391, 392, 393, and 394 each having a metal pattern for signal transmission. In one embodiment, the FPCB may be formed in a multi-layer structure in which the plurality of substrates 391, 392, 393, and 394 are stacked in a stacking direction (e.g., in a Z-axis direction with respect to the central portion of FIG. 3C). In this case, the metal patterns formed on the respective substrates 391, 392, 393, and 394 may allow electrical signals to be transmitted between a plurality of components (e.g., the first PCB 271 and the second PCB 272 of FIG. 2A) connected by the FPCB. In one embodiment, when the FPCB is formed in a multi-layer structure, components may be mounted with high density inside an electronic device through the arrangement of three-dimensional metal patterns.

In one embodiment, the plurality of substrates may each include a base layer 3911, 3921, 3931, and 3941, a metal layer 3912, 3922, 3932, and 3942, a dielectric layer 3914, 3924, 3934, and 3944, and a bonding layer 3913, 3923, 3933, and 3943. In one embodiment, the base layers 3911, 3921, 3931, and 3941 may be provided in the form of a film and formed of a polyimide (PI) material. In one embodiment, the metal layers 3912, 3922, 3932, and 3942 may be stacked on one surface of the bases layer 3911, 3921, 3931, and 3941 and form a metal pattern for a circuit on the surface of the base layer. The metal layers 3912, 3922, 3932, and 3942 may be formed of a highly conductive metal material, for example, copper. In one embodiment, the metal layers 3912, 3922, 3932, and 3942 may be stacked on the surface of the base layers 3911, 3921, 3931, and 3941 through various known methods. For example, the metal layers 3912, 3922, 3932, and 3942 may be stacked on the surface of the base layers 3911, 3921, 3931, and 3941 through various methods such as sputtering, plating, or laminating. In one embodiment, the surface of the metal layers 3912, 3922, 3932, and 3942 may be etched to form a designed metal pattern. In this case, as shown in FIG. 4A, based on a cross section parallel to the stacking direction, the metal layers 3912, 3922, 3932, and 3942 may include a portion protruding through the metal pattern and a portion removed through etching, thereby forming an uneven surface according to the metal pattern. In one embodiment, the dielectric layers 3914, 3924, 3934, and 3944 may be stacked on an outer surface of the metal layers 3912, 3922, 3932, and 3942 to cover the metal layers 3912, 3922, 3932, and 3942. The dielectric layers 3914, 3924, 3934, and 3944 may include an insulating material, for example, a material such as polyester, polyimide, liquid crystal polymer (LCP), or fluoropolymer. In one embodiment, the bonding layers 3913, 3923, 3933, and 3943 may bond the metal layers 3912, 3922, 3932, and 3942 and the dielectric layers 3914, 3924, 3934, and 3944.

In one embodiment, when the plurality of substrates 391, 392, 393, and 394 are stacked, a stepped space 396 by uneven surfaces may be formed inside the FPCB. In one embodiment, the stepped space 396 may be formed inside the FPCB to extend along an extending direction. In one embodiment, the FPCB may include a waterproof member 397 disposed between the plurality of substrates to fill the stepped space 396 formed in the sealing portion 3900. In this case, the waterproof member 397 may fill the stepped space 396 formed in the sealing portion 3900, at the same time bonding adjacent substrates forming the stepped space 396.

Accordingly, the sealing portion 3900 of the FPCB may prevent moisture from entering through the stepped space 396, thereby preventing moisture from entering an extending portion disposed in the first space (or the second space) from a flexible portion (e.g., the flexible portion 3903 of FIG. 3B) along the inside of the FPCB. In one embodiment, the waterproof member 397 may be a bonding material formed by applying a prepreg between the plurality of substrates. In one embodiment, the waterproof member 397 may be an elastic sheet inserted between the plurality of substrates. However, this is merely an example, and various materials having waterproof performance may be applied to the waterproof member 397. In one embodiment, when a plurality of stepped spaces 396 are formed inside the sealing portion 3900 based on the cross section, a plurality of waterproof members 397 may be disposed between adjacent substrates inside the sealing portion 3900 to fill a plurality of stepped spaces, respectively.

In one embodiment, the waterproof member 397 may be omitted from another portion adjacent to the sealing portion 3900, for example, a flexible portion (e.g., the flexible portion 3903 of FIG. 3B) or an extension portion (e.g., the extension portion 3904 of FIG. 3B). In this case, the stress according to the flexible portion and the extension portion being bent may decrease, which may improve the service life of the FPCB.

Referring to FIG. 4A, in one embodiment, the sealing portion 3900 may include a plurality of substrates 391, 392, 393, and 394 sequentially stacked, based on a cross section. In this case, the plurality of substrates 391, 392, 393, and 394 may be stacked so that respective uneven surfaces thereof may face the same direction. In one embodiment, the plurality of substrates 391, 392, 393, and 394 may include a first substrate 391, a second substrate 392, a third substrate 393, and a fourth substrate 394 that are sequentially stacked. In one embodiment, the first substrate 391 may include a first base layer 3911, a first metal layer 3912, a first bonding layer 3913, and a first dielectric layer 3914. The second substrate 392 may include a second base layer 3921, a second metal layer 3922, a second bonding layer 3923, and a second dielectric layer 3924. The third substrate 393 may include a third base layer 3931, a third metal layer 3932, a third bonding layer 3933, and a third dielectric layer 3934. The fourth substrate 394 may include a fourth base layer 3941, a fourth metal layer 3942, a fourth bonding layer 3943, and a fourth dielectric layer 3944. In this case, a first stepped space 396a may be formed between the first substrate 391 and the second substrate 392. A second stepped space 396b may be formed between the second substrate 392 and the third substrate 393. A third stepped space 396c may be formed between the third substrate 393 and the fourth substrate 394. In one embodiment, the sealing portion 3900 may include a first waterproof member 3971 disposed between the first base layer 3911 and the second dielectric layer 3924 to fill the first stepped space 396a, a second waterproof member 3972 disposed between the second base layer 3921 and the third dielectric layer 3934 to fill the second stepped space 396b, and a third waterproof member 3973 disposed between the third base layer 3931 and the fourth dielectric layer 3944 to fill the third stepped space 396c. In this case, the surface of the sealing portion 3900 may be sealed by the sealing member 380, and the stepped space 396 therein may be sealed through the waterproof member 397. Thus, effective waterproof performance may be secured.

Referring to FIG. 4B, in one embodiment, a sealing portion 3900' may form a stacked structure of a plurality of substrates 391, 392, 393, and 394 that reduces stepped spaces 396d and 396e. For example, based on a cross section shown in FIG. 4B, outermost substrates 391 and 394 of the plurality of substrates 391, 392, 393, and 394 may be disposed such that uneven surfaces thereof face the outside. In this case, a surface of the sealing portion 3900' may be compressed by the sealing member 380. Thus, when the uneven surfaces face the outside, moisture entering through the uneven surfaces may be effectively blocked. In one embodiment, the plurality of substrates 391, 392, 393, and 394 may include a first substrate 391, a second substrate 392, a third substrate 393, and a fourth substrate 394 that are sequentially stacked.

In one embodiment, the first substrate 391 may include a first base layer 3911, a first metal layer 3912 stacked on the first base layer 3911 and forming a first uneven surface, a first bonding layer 3913, and a first dielectric layer 3914. The second substrate 392 may include a second base layer 3921, a second metal layer 3922 stacked on the second base layer 3921 and forming a second uneven surface in a direction facing the first base layer 3911, a second bonding layer 3923, and a second dielectric layer 3924. The third substrate 393 may include a third base layer 3931 facing the second base layer 3921, a third metal layer 3932 stacked on the third base layer 3931 and forming a third uneven surface in a direction opposite to the second uneven surface, a third bonding layer 3933, and a third dielectric layer 3934. The fourth substrate 394 may include a fourth base layer 3941, a fourth metal layer 3942 stacked on the fourth base layer 3941 and forming a fourth uneven surface in a direction opposite to the third uneven surface, a fourth bonding layer 3943, and a fourth dielectric layer 3944. In this case, a first stepped space 396d may be formed by the second uneven surface between the first substrate 391 and the second substrate 392. A second stepped space 396e may be formed by the third uneven surface between the third substrate 393 and the fourth substrate 394. In one embodiment, the sealing portion 3900' may include a first waterproof member 3971b disposed between the first base layer 3911 and the second dielectric layer 3924 to fill the first stepped space 396d, and a second waterproof member 3972b disposed between the third dielectric layer 3934 and the fourth base layer 3941 to fill the second stepped space 396e. In this case, the second substrate 392 and the third substrate 393 may be stacked so that the third base layer 3931 and the fourth base layer 3941 face each other, whereby a stepped space therebetween may be removed. In addition, the first substrate 391 and the fourth substrate 394 may be stacked so that respective uneven surfaces thereof may face the outside, and the surfaces thereof may be compressed by the sealing member 380. Thus, the sealing member 3900' may secure effective waterproof performance by minimizing the stepped spaces 396d and 396e formed therein.

Referring to FIG. 4C, in one embodiment, a plurality of substrates 491, 492, 493, and 494 may form a stacked structure for reducing a stepped space 496 formed therebetween. For example, of the plurality of substrates 491, 492, 493, and 494, a pair of substrates 492 and 493 stacked adjacent to each other may be stacked with respective uneven surfaces facing each other, such that a single stepped space 496 may be formed between the respective uneven surfaces. In this case, the pair of substrates 492 and 493 disposed with the respective uneven surfaces facing each other may be formed such that the respective uneven surfaces may have mutually matching cross sections.

In one embodiment, the first substrate 491 may include a first base layer 4911, a first metal layer 4912 stacked on the first base layer 4911 and forming a first uneven surface, a first bonding layer 4913, and a first dielectric layer 4914. The second substrate 492 may include a second base layer 4921 stacked on the first base layer 4911, a second metal layer 4922 stacked on the second base layer 4921 and forming a second uneven surface in a direction opposite to the first uneven surface, a second bonding layer 4923, and a second dielectric layer 4924. The third substrate 493 may include a third base layer 4931, a third metal layer 4932 stacked on the third base layer 4931 and forming a third uneven surface in a direction facing the second uneven surface, a third bonding layer 4933, and a third dielectric layer 4934. The fourth substrate 494 may include a fourth base layer 4941 stacked on the third base layer 4931, a fourth metal layer 4942 stacked on the fourth base layer 4941 and forming a fourth uneven surface in a direction opposite to the third uneven surface, a fourth bonding layer 4943, and a fourth dielectric layer 4944. In this case, a sealing portion 3900" may include a single stepped space 496 formed between the second substrate 492 and the third substrate 493. In one embodiment, the sealing portion 3900" may include a waterproof member 497c disposed between the second dielectric layer 4924 and the third dielectric layer 4934 to fill the stepped space 496. In this case, the second uneven surface and the third uneven surface of the first substrate 492 and the third substrate 493 may have mutually matching cross sections, whereby the waterproof member 497c may be formed in a simplified cross section to effectively seal the stepped space 496. In one embodiment, the first substrate 491 and the fourth substrate 494 may be stacked so that the respective uneven surfaces may face outward, and the surfaces thereof may be compressed by the sealing member 380.

Meanwhile, although FIGS. 4A to 4C illustrate a stacked structure of a plurality of substrates in a case in which a FPCB includes four substrates that are sequentially stacked, the shown stacked structure is merely an example, and the multi-layer structure of the FPCB is not limited thereto. For example, the FPCB may be formed in a multi-layer structure in which three or at least five substrates are stacked. In this case, the waterproof structure of the sealing portion disclosed herein may apply in the same or similar manner.

Figure 5:
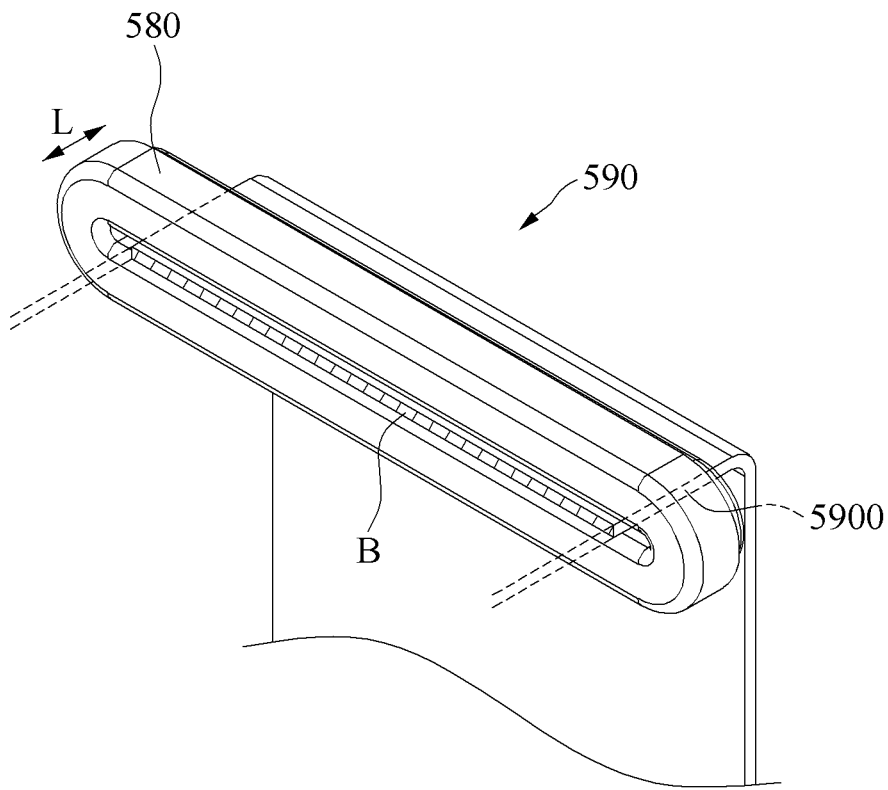
FIG. 5 is a view illustrating a sealing portion of a FPCB according to one embodiment of the disclosure.

FIG. 5 is a view illustrating a sealing portion of a FPCB according to an embodiment of the disclosure.

Figure 6A:
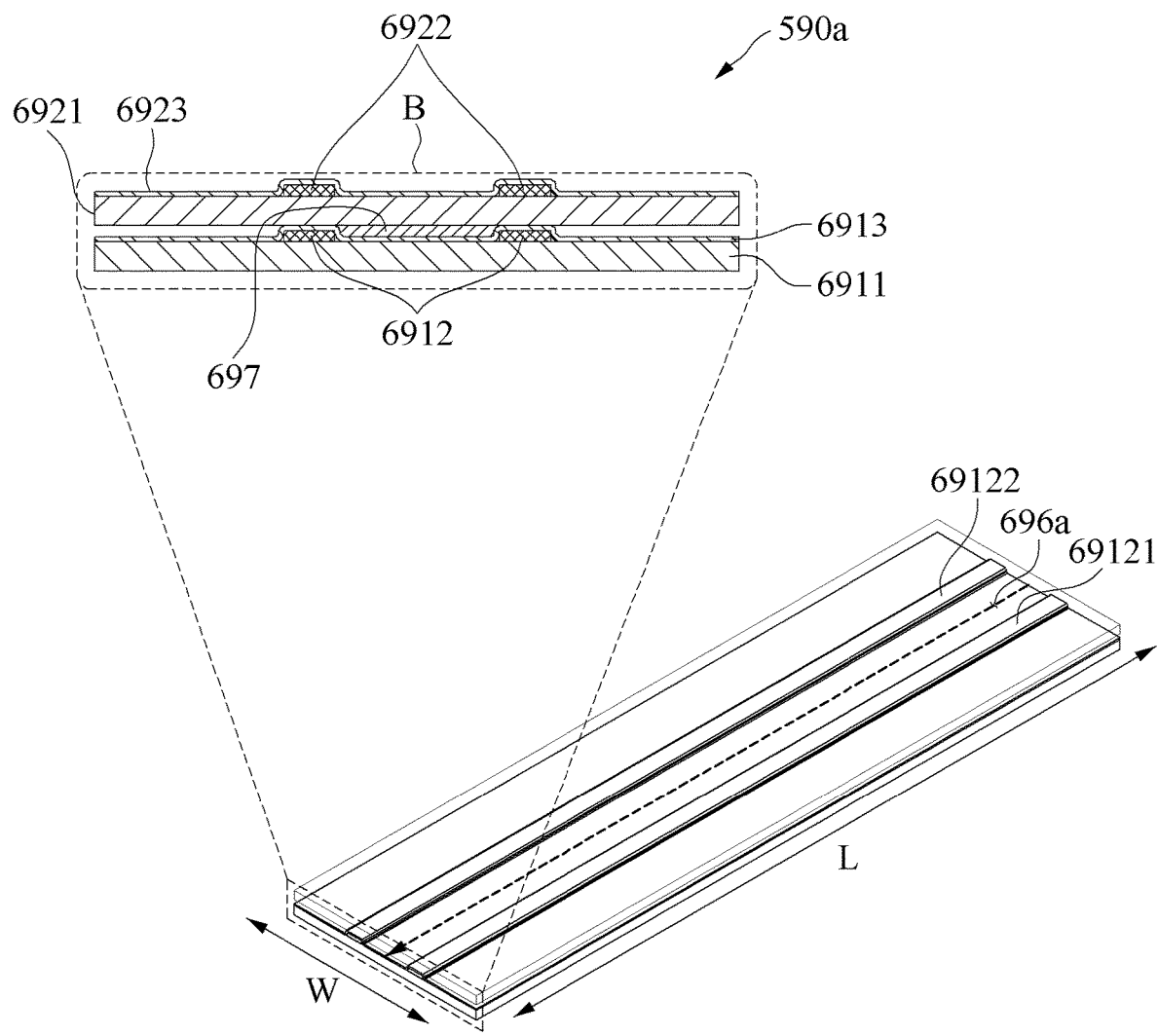
FIGS. 6A, 6B, and 6C are views illustrating sealing portions of FPCBs according to various embodiments of the disclosure.
Figure 6B:
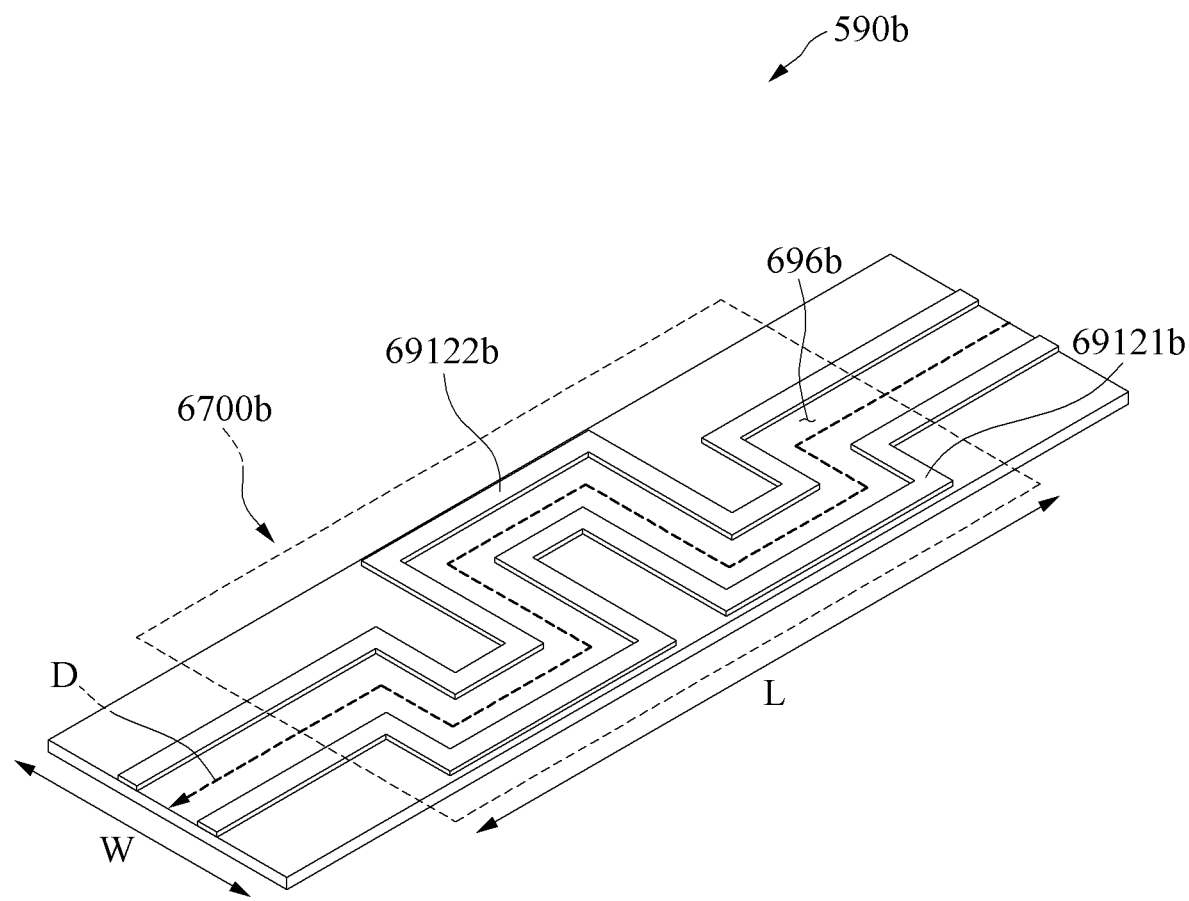
Figure 6C:
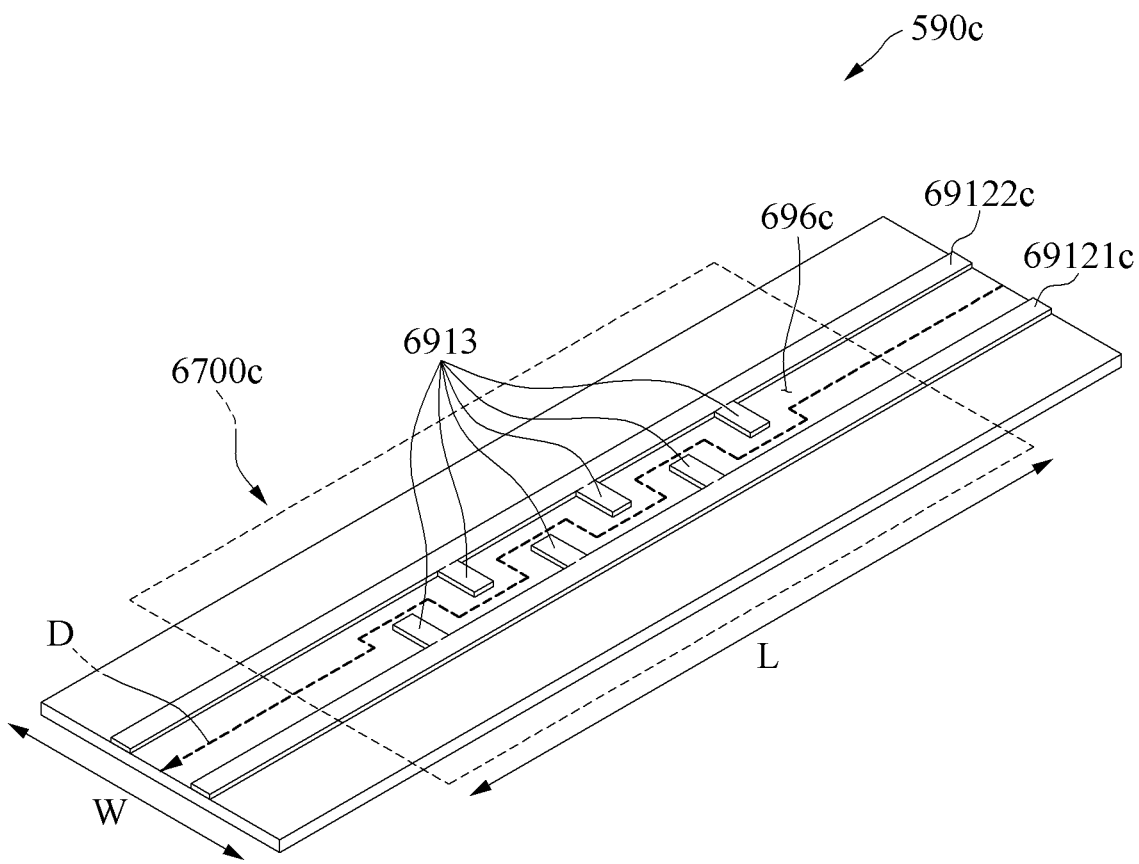

FIGS. 6A, 6B, and 6C are views illustrating sealing portions of FPCBs according to various embodiments of the disclosure.

Figure 7A:
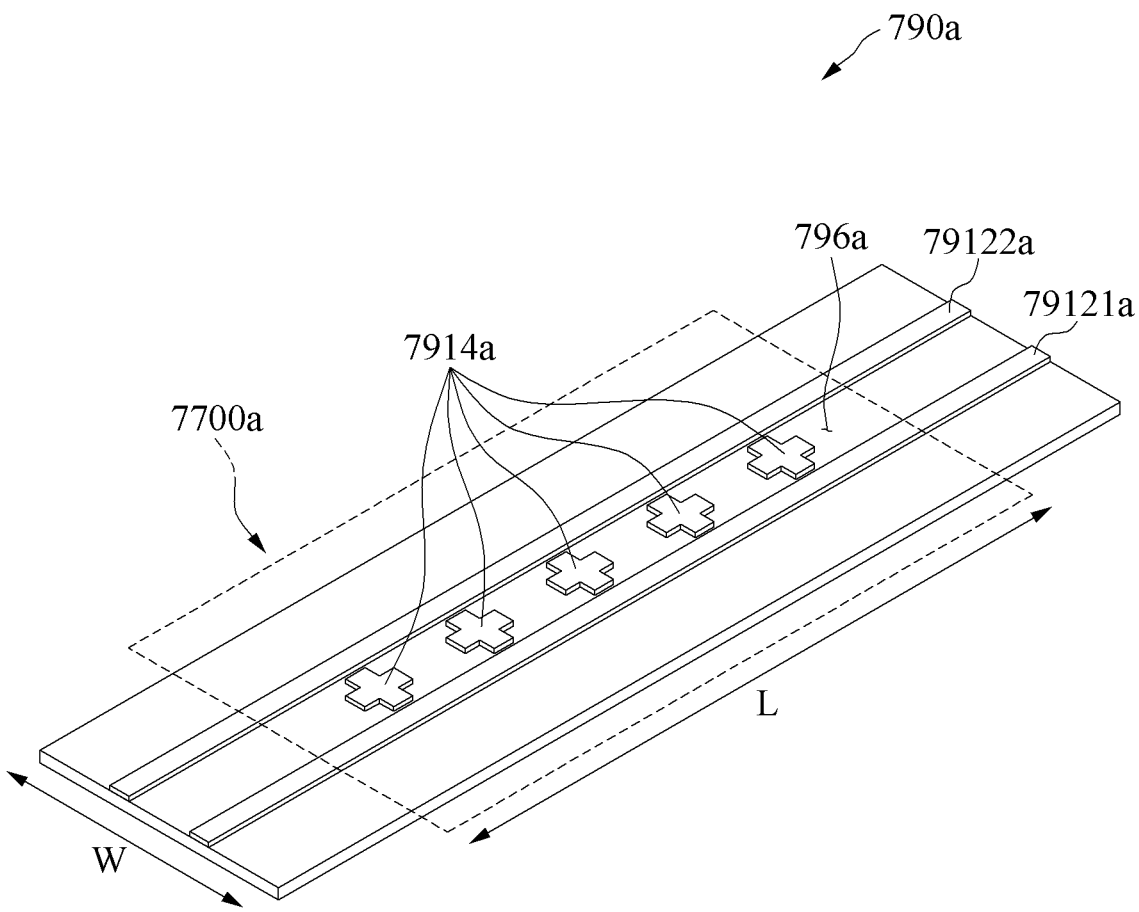
FIGS. 7A, 7B, and 7C are views illustrating sealing portions of FPCBs according to various embodiments of the disclosure.
Figure 7B:
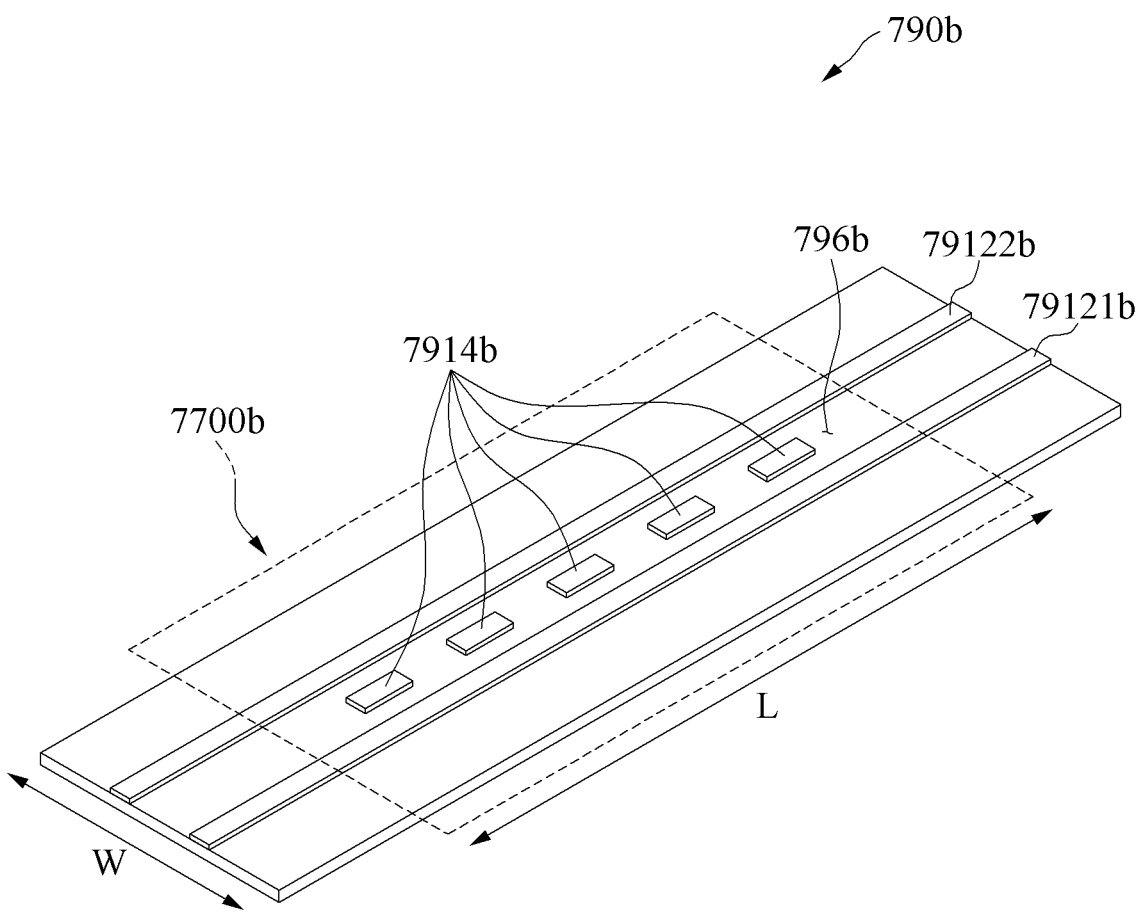
Figure 7C:
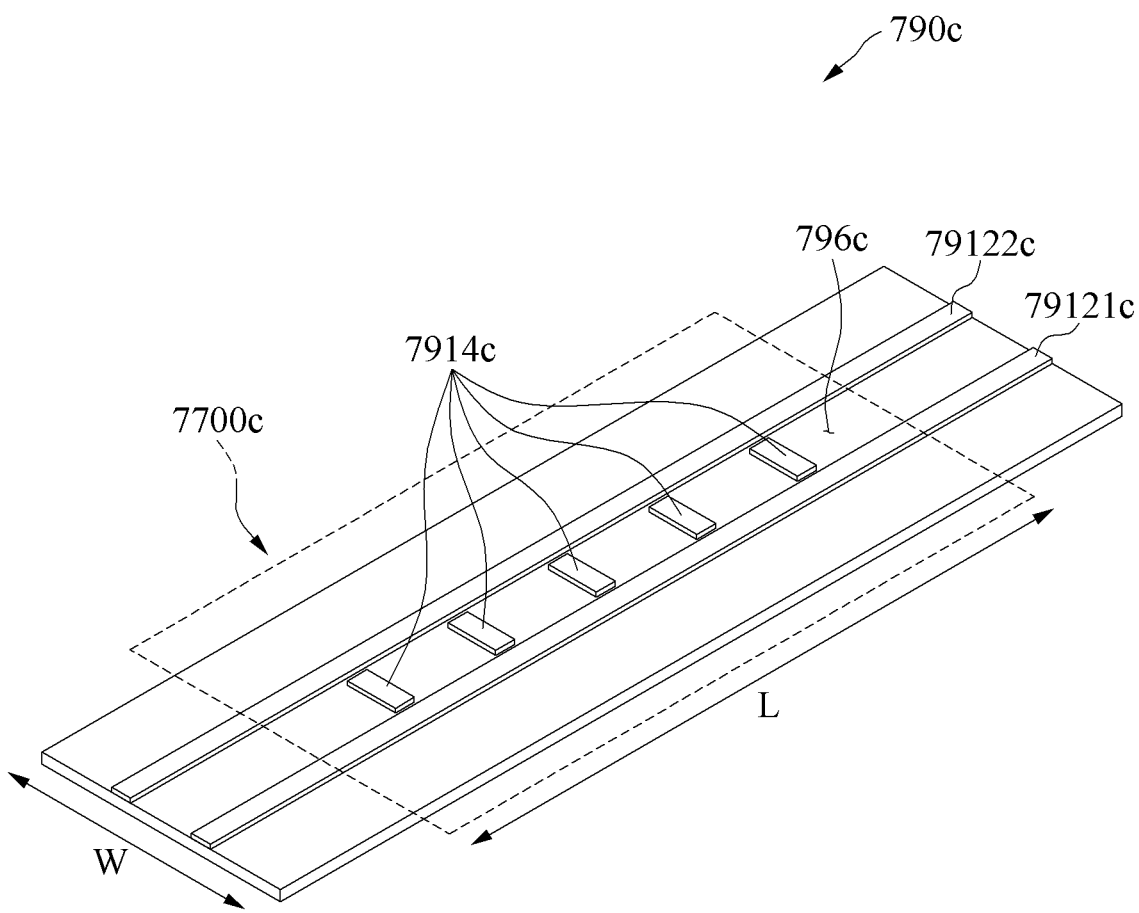

FIGS. 7A, 7B, and 7C are views illustrating sealing portions of FPCBs according to various embodiments of the disclosure.

Figure 8:
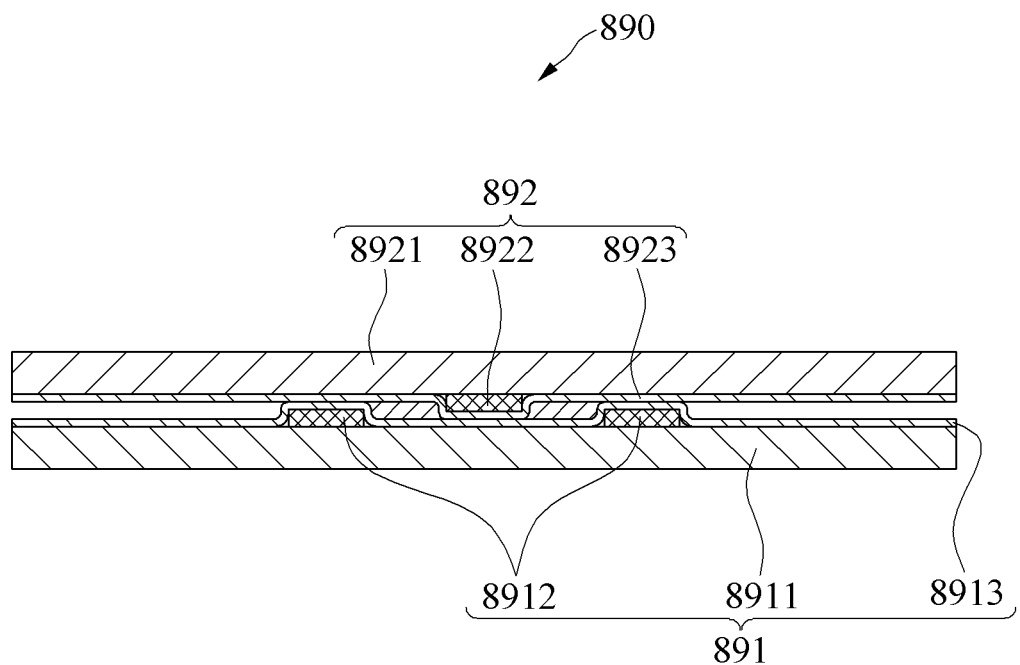
FIG. 8 is a cross-sectional view illustrating a sealing portion of a FPCB according to an embodiment of the disclosure.

FIG. 8 is a cross-sectional view illustrating a sealing portion of a FPCB according to an embodiment of the disclosure.

Referring to FIGS. 5, 6A to 6C, 7A to 7C, and 8, in one embodiment, a sealing portion 5900 of a FPCB 590 may be designed to have a structure for improving waterproof performance. In one embodiment, a surface of the sealing portion 5900 of the FPCB 590 may be surrounded by a sealing member 580 as shown in FIG. 5. In this case, the sealing member 580 may be connected to compress the surface of the sealing portion 5900, thereby preventing moisture from entering through the surface of the sealing portion 5900, for example, moisture from entering through an opening (e.g., the opening 331a of FIG. 3B) as shown in FIG. 3B. In one embodiment, the sealing portion 5900 may have a longitudinal direction L parallel to an extending direction. In one embodiment, when the sealing portion 5900 is formed in a multi-layer structure in which a plurality of substrates are stacked, an area B shown in FIG. 5 may be construed as illustrating a cross section of a pair of substrates stacked adjacent to each other to form a stepped space.

In one embodiment, the sealing portion 5900 may be formed to have a relatively high waterproof performance compared to another portion of the FPCB 590, for example, a flexible portion (e.g., the flexible portion 3903 in FIG. 3B) or the extension portion 3904. For example, the sealing portion 5900 may be formed such that the uneven surfaces forming the stepped space may secure a relatively high waterproof performance compared to the uneven surfaces formed in the other portion of the FPCB 590.

Referring to FIG. 6A, a FPCB 590a may include a first substrate 691 and a second substrate 692 stacked on the first substrate 691. In one embodiment, the first substrate 691 may include a first base layer 6911, a first metal layer 6912 forming an uneven surface according to a metal pattern on a surface of the first base layer 6911, and a first dielectric layer 6913 covering the first metal layer 6912. The second substrate 692 may include a second base layer 6921, a second metal layer 6922, and a second dielectric layer 6923. In this case, a stepped space 696a may be formed by uneven surfaces between the first substrate 691 and the second substrate 692. In one embodiment, when the first metal layer 6912 includes a first metal pattern 69121 and a second metal pattern 69122 that are spaced apart from each other in parallel as shown in FIG. 6A, the stepped space 696a may be formed between the first metal pattern 69121 and the second metal pattern 69122.

In this case, resistance received in the process of moisture passing through the stepped space 696a may be proportional to an area of the stepped space 696a and inversely proportional to a distance of a travel path of the moisture as shown in the following equation.

Water Resistance(R)∝Length of Travel Path of Moisture/Area of Stepped Space

In one embodiment, the FPCB 590a may have a ratio of the area of the stepped space to a length of the sealing portion 5900 in the extending direction that is less than a ratio of the area of the stepped space to a length of another portion (e.g., the flexible portion) of the FPCB 590a in the extending direction. In other words, the FPCB 590a may have a waterproof performance of the stepped space 696a formed in the sealing portion 5900 that is higher than the waterproof performance of the stepped space formed on the other portion.

In one embodiment, the sealing portion 5900 may include a waterproof member 697 disposed in the stepped space 696a as shown in FIG. 6A. In this case, the area within the stepped space 696a through which moisture may move through the waterproof member 697 may decrease, which may improve the waterproof performance of the sealing portion 5900.

Referring to FIG. 6B, a FPCB 590b according to one embodiment may be formed to increase a travel distance of moisture through a stepped space 696b in a sealing portion 6700b. For example, the stepped space 696b in the sealing portion 6700b may be formed to form a meander pattern. For example, the FPCB 590b may include a first metal pattern 69121b and a second metal pattern 69122b forming the stepped space 696b, wherein the first metal pattern 69121b and the second metal pattern 69122b may be provided in the shape of being bent to form a meander pattern in the sealing portion 6700b. In this case, the first metal pattern 69121b and the second metal pattern 69122b in another area of the FPCB 590*b* except for the sealing portion 6700*b* may be provided in the shape of straight lines to perform effective signal transmission. Accordingly, when moisture enters through the stepped space 696*b* formed in the sealing portion 6700*b*, the length of travel path D of the moisture may increase, whereby the waterproof performance of the sealing portion 6700*b* may improve.

Referring to FIG. 6C, a FPCB 590*c* according to one embodiment may include a first metal pattern 69121*c* and a second metal pattern 69122*c* forming a stepped space 696*c* therebetween. In this case, the first metal pattern 69121*c* and the second metal pattern 69122*c* may include one or more stub shapes protruding toward the inside of the stepped space 696*c*. In this case, an area of the stepped space 696*c* in the sealing portion may decrease through the stub shapes, and at the same time a length of travel path of moisture through the sealing portion 6700*c* may increase, which may improve the waterproof performance of the sealing portion 6700*c*.

Referring to FIGS. 7A to 7C, a FPCB 790*a*, 790*b*, 790*c* according to one embodiment may include a first metal pattern 79121*a*, 79121*b*, 79121*c* and a second metal pattern 79122*a*, 79122*b*, 79122*c* forming a stepped space 796*a*, 796*b*, 796*c* therebetween, and include one or more dummy patterns 7914*a*, 7914*b*, 7914*c* provided between the first metal pattern 79121*a*, 79121*b*, 79121*c* and the second metal pattern 79122*a*, 79122*b*, 79122*c* for interfering with travel of moisture through the stepped space 796*a*, 796*b*, 796*c*, at the same time reducing a cross-sectional area of the stepped space 796*a*, 796*b*, 796*c*. In this case, the first metal pattern 79121*a*, 79121*b*, 79121*c* and the second metal pattern 79122*a*, 79122*b*, 79122*c* may be provided in the shape of straight lines in the sealing portion 7700*a*, 7700*b*, 7700*c* to perform effective signal transmission. Accordingly, it is possible to maintain the signal transmission performance in the sealing portion 7700*a*, 7700*b*, 7700*c*, at the same time effectively improving the waterproof performance through the dummy patterns 7914*a*, 7914*b*, 7914*c*.

Referring to FIG. 8, a FPCB 890 according to one embodiment may include a first substrate 891 including a first base layer 8911, a first metal layer 8912 forming a first uneven surface, and a first dielectric layer 8913, and a second substrate 892 including a second base layer 8921, a second metal layer 8922 forming a second uneven surface, and a second dielectric layer 8923. In one embodiment, the first substrate 891 and the second substrate 892 may be stacked such that the first metal layer 8912 and the second metal layer 8922 may face each other. In this case, the facing uneven surfaces of the first substrate 891 and the second substrate 892 may be formed such that the respective metal patterns thereof do not overlap each other. In this case, a cross section of a stepped space formed between the first substrate 891 and the second substrate 892 may decrease, which may improve the waterproof performance of the FPCB 890.

According to one embodiment, an electronic device 301 may include: a display 361 including a first area 361*a* and a second area 361*b*; a first housing 310 supporting the first area 361*a* and forming a first space 310*a* positioned on a rear surface of the first area 361*a*; a second housing 320 supporting the second area 361*b* and forming a second space 310*b* positioned on a rear surface of the second area 361*b*; a hinge structure 334 connecting the first housing 310 and the second housing 320 to be foldable about a folding axis and allowing the first area 361*a* and the second area 361*b* to change between a first state of forming substantially the same plane and a second state of facing each other; a first bracket 331 connecting the first housing 310 and the hinge structure 334 and having a first opening 331*a* penetrating through a surface thereof; a second bracket 332 connecting the second housing 320 and the hinge structure 334 and having a second opening 332*a* penetrating through a surface thereof; and a FPCB 390 extending from the first space 310*a* to the second space 310*b* across the hinge structure 334 in an extending direction, and formed in a multi-layer structure in which a plurality of substrates 391, 392, 393, and 394 having uneven surfaces according to metal patterns are stacked in a stacking direction, wherein the FPCB 390 may include a first sealing portion 3900*a* positioned inside the first opening 331*a* and a second sealing portion 3900*b* positioned inside the second opening 332*a*, and a waterproof member 397 for sealing a space between the plurality of substrates 391, 392, 393, and 394 may be disposed in the first sealing portion 3900*a* and the second sealing portion 3900*b*.

In one embodiment, the electronic device 301 may further include: a first sealing member 380*a* for sealing the first opening 331*a*; and a second sealing member 380*b* for sealing the second opening 332*a*, wherein a surface of the first sealing portion 3900*a* may be compressed by the first sealing member 380*a*, and a surface of the second sealing portion 3900*b* may be compressed by the second sealing member 380*b*.

In one embodiment, the plurality of substrates 391, 392, 393, and 394 may each include: a base layer 3911; a metal layer 3912 stacked on one surface of the base layer 3911, and forming the uneven surface; and a dielectric layer 3914 stacked to cover the metal layer 3912, wherein a stepped space 396 by the uneven surface may be formed between the plurality of substrates 391, 392, 393, and 394, and the waterproof member 397 may be disposed in the stepped space 396.

In one embodiment, a pair of adjacent substrates 492 and 493 among the plurality of substrates may be stacked such that respective uneven surfaces thereof may face each other, and the waterproof member 497*c* may be disposed between the facing uneven surfaces of the pair of substrates 492 and 493.

In one embodiment, based on a cross section parallel to the stacking direction, the facing uneven surfaces of the pair of substrates 492 and 493 may be formed to have mutually matching cross sections such that the stepped space 496 may be formed therebetween.

In one embodiment, based on a cross section parallel to the stacking direction, the facing uneven surfaces of the pair of substrates 492 and 493 may be formed not to overlap each other.

In one embodiment, the plurality of substrates 491, 492, 493, and 494 may include: based on the cross section parallel to the stacking direction, a first substrate 491 including a first base layer 4911 and a first metal layer 4912 stacked on the first base layer 4911 and forming a first uneven surface; a second substrate 492 including a second base layer 4921 stacked on the first base layer 4911, and a second metal layer 4922 stacked on the second base layer 4921 and forming a second uneven surface in a direction opposite to the first uneven surface; a third substrate 493 including a third base layer 4931 and a third metal layer 4932 stacked on the third base layer 4931 and forming a third uneven surface in a direction facing the second uneven surface; and a fourth substrate 494 including a fourth base layer 4941 stacked on the third base layer 4931, and a fourth metal layer 4942 stacked on the fourth base layer 4941 and forming a fourth uneven surface in a direction opposite to the third uneven surface, wherein the waterproof member 497c may be disposed between the second uneven surface and the third uneven surface.

In one embodiment, the plurality of substrates 391, 392, 393, and 394 may include: based on the cross section parallel to the stacking direction, a first substrate 391 including a first base layer 3911 and a first metal layer 3912 stacked on the first base layer 3911 and forming a first uneven surface; a second substrate 392 including a second base layer 3921, and a second metal layer 3922 stacked on the second base layer 3921 and forming a second uneven surface in a direction facing the first base layer 3911; a third substrate 393 including a third base layer 3931 facing the second base layer 3921, and a third metal layer 3932 stacked on the third base layer 3931 and forming a third uneven surface in a direction opposite to the second uneven surface; and a fourth substrate 394 including a fourth base layer 3941, and a fourth metal layer 3942 stacked on the fourth base layer 3941 and forming a fourth uneven surface in a direction opposite to the third base layer 3931, wherein a first waterproof member 3971b may be disposed between the first base layer 3911 and the second uneven surface, and a second waterproof member 3972b may be disposed between the fourth base layer 3941 and the third uneven surface.

In one embodiment, the FPCB 390 may include: a first flexible portion 3903a to be bent to an outer side of the first opening 331a from the first sealing portion 3900a toward the hinge structure 334; and a second flexible portion 3903b to be bent to an outer side of the second opening 332a from the second sealing portion 3900b toward the hinge structure 334, wherein the waterproof member may be omitted from the first flexible portion 3903a and the second flexible portion 3903b.

In one embodiment, the FPCB 390 may include: a first extension portion 3904a to be bent to the outer side of the first opening 331a from the first sealing portion 3900a toward the first space 310a; and a second extension portion 3904b to be bent to the outer side of the second opening 332a from the second sealing portion 3900b toward the second space 310b, wherein the waterproof member may be omitted from the first extension portion 3904a and the second extension portion 3904b.

In one embodiment, a stepped space 696a by the uneven surface may be formed between the plurality of substrates 691 and 692, and a ratio of an area of the stepped space to a length of the first sealing portion 3900a and the second sealing portion 3900b in the extending direction may be less than a ratio of an area of the stepped space to a length of the first flexible portion 3903a and the second flexible portion 3903b in the extending direction.

In one embodiment, a stepped space 696b by the uneven surface may be formed between the plurality of substrates, and based on a state in which the stepped space 696b is viewed in the stacking direction, the stepped space 696b may form a meander pattern in the first sealing portion 3900a or the second sealing portion 3900b.

In one embodiment, a stepped space by the uneven surface may be formed between the plurality of substrates, and based on a state in which the stepped space is viewed in the stacking direction, the metal patterns 69121c and 69121b may include one or more stub shapes protruding toward the inside of the stepped space, in the first sealing portion 3900a or the second sealing portion 3900b.

In one embodiment, a stepped space 796a by the uneven surface may be formed between the plurality of substrates, and based on a state in which the stepped space 796a is viewed in the stacking direction, the metal patterns may include one or more dummy patterns 7914a formed to be positioned inside the stepped space, in the first sealing portion 3900a or the second sealing portion 3900b.

In one embodiment, the waterproof member 397 may be formed by applying a prepreg between the plurality of substrates or may be an elastic sheet inserted between the plurality of substrates.

According to one embodiment, a FPCB 390 may include: a central portion 3901; a first flexible portion 3903a connected to the central portion 3901 and configured to be partially bent; a second flexible portion 3903b connected to the central portion 3901 to be opposite to the first flexible portion 3903a and configured to be partially bent; a first sealing portion 3900a connected to the first flexible portion 3903a to be opposite to the central portion 3901; a second sealing portion 3900b connected to the second flexible portion 3903b to be opposite to the central portion 3901; a first extension portion 3904a connected to the first sealing portion 3900a to be opposite to the first flexible portion 3903a and configured to be partially bent; and a second extension portion 3904b connected to the second sealing portion 3900b to be opposite to the second flexible portion 3903b and configured to be partially bent, wherein the FPCB 390 may be formed in a multi-layer structure in which a plurality of substrates 391, 392, 393, and 394 having uneven surfaces according to metal patterns may be stacked in a stacking direction, a stepped space 396 by the uneven surfaces may be formed between the plurality of substrates 391, 392, 393, and 394, and a ratio of an area of the stepped space 396 to a length of the first sealing portion 3900a and the second sealing portion 3900b may be less than or equal to a ratio of an area of the stepped space 396 to a length of the first flexible portion 3903a and the second flexible portion 3903b.

In one embodiment, the FPCB 390 may further include: a waterproof member 397 disposed between the plurality of substrates to fill the stepped space 396, wherein the waterproof member 397 may be positioned in the first sealing portion 3900a and the second sealing portion 3900b.

In one embodiment, the waterproof member 397 may be omitted from the first flexible portion 3903a, the second flexible portion 3903b, the first extension portion 3904a, and the second extension portion 3904b.

In one embodiment, in a state in which the stepped space formed in the first sealing portion 3900a and the second sealing portion 3900b is viewed in the stacking direction, the metal patterns may be formed to form a meander pattern.

According to one embodiment, an electronic device 301 may include: a display 361 including a first area 361a and a second area 361b; a first housing 310 including a first surface on which the first area 361a is disposed, and a second surface opposite to the first surface; a second housing 320 including a third surface on which the second area 361b is disposed, and a fourth surface opposite to the third surface; a hinge structure 334 connecting the first housing 310 and the second housing 320 to be foldable about a folding axis and allowing the first area 361a and the second area 361b to change between a first state of forming substantially the same plane and a second state of facing each other; a first bracket 331 connecting the first housing 310 and the hinge structure 334 and including a first opening 331a penetrating through a surface thereof; a second bracket 332 connecting the second housing 320 and the hinge structure 334 and including a second opening 332a penetrating through a surface thereof; a first PCB disposed between the first bracket 331 and the second surface; a second PCB disposed between the second bracket 332 and the fourth surface; a FPCB 390 with at least a portion disposed between the hinge structure 334 and the display 361, and both ends respectively connected to the first PCB 271 and the second PCB 272 by passing through the first opening 331a and the second opening 332a; a first sealing member 380a surrounding a perimeter of a first sealing portion 3900a of the FPCB 390 positioned inside the first opening 331a, and sealing between the first opening 331a and the first sealing portion 3900a; and a second sealing member 380b surrounding a perimeter of a second sealing portion 3900b of the FPCB 390 positioned inside the second opening 332a, and sealing between the second opening 332a and the second sealing portion 3900b, wherein the FPCB 390 may be formed in a multi-layer structure in which a plurality of substrates having uneven surfaces according to metal patterns are stacked in a stacking direction, and a waterproof member 397 for filling a stepped space 396 formed by the uneven surfaces between the plurality of substrates may be disposed in the first sealing portion 3900a and the second sealing portion 3900b.

In one embodiment, the first bracket and the second bracket are rotatably connected to the hinge structure.

In one embodiment, the second bracket is disposed between the second area and the second PCB.

In one embodiment, the first bracket has one or more first openings formed to penetrate therethrough toward the first area, and the second bracket has one or more second openings formed to penetrate therethrough toward the second area.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device, comprising:
a flexible display comprising a first area and a second area;
a first housing supporting the first area of the flexible display;
a second housing supporting the second area;
a hinge structure rotatably connecting the first housing and the second housing;
a first bracket disposed in the first housing and having a first opening;
a second bracket disposed in the second housing and having a second opening; and
a flexible printed circuit board (FPCB) extending from a first space formed by the first housing to a second space formed by the second housing across the hinge structure, and formed in a multi-layer structure,
wherein the FPCB comprises a first sealing portion disposed in the first opening, a second sealing portion disposed in the second opening and, flexible portions connected to each of the first sealing portion and the second sealing portion and extending toward the hinge structure, and
wherein at least one stepped space is formed between a plurality of layers of the flexible portion of the FPCB and at least one waterproof member is disposed in at least one stepped space between a plurality of layers of each of the first sealing portion and the second sealing portion of the FPCB.

2. The electronic device of claim 1, further comprising:
a first sealing member for sealing the first opening; and
a second sealing member for sealing the second opening,
wherein a surface of the first sealing portion is compressed by the first sealing member, and
wherein a surface of the second sealing portion is compressed by the second sealing member.

3. The electronic device of claim 1,
wherein the FPCB including a plurality of substrates stacked in a stacking direction, and
wherein the plurality of substrates each comprise:
a base layer;
a metal layer stacked on one surface of the base layer, and forming an uneven surface; and
a dielectric layer stacked to cover the metal layer,
wherein a stepped space by the uneven surface is formed between the plurality of substrates, and
wherein the waterproof member is disposed in the stepped space.

4. The electronic device of claim 3,
wherein a pair of adjacent substrates among the plurality of substrates are stacked such that respective uneven surfaces thereof face each other, and
wherein the waterproof member is disposed between the facing uneven surfaces of the pair of adjacent substrates.

5. The electronic device of claim 4, wherein, based on a cross section parallel to the stacking direction, the facing uneven surfaces of the pair of adjacent substrates are formed to have mutually matching cross sections such that the stepped space is formed therebetween.

6. The electronic device of claim 4, wherein, based on a cross section parallel to the stacking direction, the facing uneven surfaces of the pair of adjacent substrates are formed such that respective metal patterns thereof do not overlap each other.

7. The electronic device of claim 3,
wherein the plurality of substrates, based on a cross section parallel to the stacking direction, comprise:
a first substrate comprising a first base layer and a first metal layer stacked on the first base layer and forming a first uneven surface;
a second substrate comprising a second base layer stacked on the first base layer, and a second metal layer stacked on the second base layer and forming a second uneven surface in a direction opposite to the first uneven surface;
a third substrate comprising a third base layer and a third metal layer stacked on the third base layer and forming a third uneven surface in a direction facing the second uneven surface; and
a fourth substrate comprising a fourth base layer stacked on the third base layer, and a fourth metal layer stacked on the fourth base layer and forming a fourth uneven surface in a direction opposite to the third uneven surface, and
wherein the waterproof member is disposed between the second uneven surface and the third uneven surface.

8. The electronic device of claim 3,
wherein the plurality of substrates, based on a cross section parallel to the stacking direction, comprise:
a first substrate comprising a first base layer and a first metal layer stacked on the first base layer and forming a first uneven surface;
a second substrate comprising a second base layer, and a second metal layer stacked on the second base layer and forming a second uneven surface in a direction facing the first base layer;

a third substrate comprising a third base layer facing the second base layer, and a third metal layer stacked on the third base layer and forming a third uneven surface in a direction opposite to the second uneven surface; and a fourth substrate comprising a fourth base layer, and a fourth metal layer stacked on the fourth base layer and forming a fourth uneven surface in a direction opposite to the third uneven surface, and wherein a first waterproof member is disposed between the first base layer and the second uneven surface, and a second waterproof member is disposed between the fourth base layer and the third uneven surface.

9. The electronic device of claim 6,
wherein the FPCB comprises:
  a first flexible portion to be bent to an outer side of the first opening from the first sealing portion toward the hinge structure; and
  a second flexible portion to be bent to an outer side of the second opening from the second sealing portion toward the hinge structure, and
wherein the waterproof member is omitted from the first flexible portion and the second flexible portion.

10. The electronic device of claim 9,
wherein the FPCB comprises:
  a first extension portion to be bent to the outer side of the first opening from the first sealing portion toward the first space; and
  a second extension portion to be bent to the outer side of the second opening from the second sealing portion toward the second space, and
wherein the waterproof member is omitted from the first extension portion and the second extension portion.

11. The electronic device of claim 9,
wherein a stepped space by the uneven surfaces is formed between the plurality of substrates, and
wherein a ratio of an area of the stepped space to a length of the first sealing portion and the second sealing portion in the extending direction is less than a ratio of an area of the stepped space to a length of the first flexible portion and the second flexible portion in the extending direction.

12. The electronic device of claim 3,
wherein a stepped space by the uneven surfaces is formed between the plurality of substrates, and
wherein based on a state in which the stepped space is viewed in the stacking direction, the stepped space forms a meander pattern in the first sealing portion or the second sealing portion.

13. The electronic device of claim 6,
wherein a stepped space by the uneven surfaces is formed between the plurality of substrates, and
wherein based on a state in which the stepped space is viewed in the stacking direction, the metal patterns comprise one or more stub shapes protruding toward the inside of the stepped space, in the first sealing portion or the second sealing portion.

14. The electronic device of claim 6,
wherein a stepped space by the uneven surface is formed between the plurality of substrates, and
wherein based on a state in which the stepped space is viewed in the stacking direction, the metal patterns comprise one or more dummy patterns formed to be positioned inside the stepped space, in the first sealing portion or the second sealing portion.

15. The electronic device of claim 3, wherein the waterproof member is formed between the plurality of substrates or is an elastic sheet inserted between the plurality of substrates.

16. A flexible printed circuit board (FPCB), the FPCB comprising:
  a central portion;
  a first flexible portion connected to the central portion and configured to be partially bent;
  a second flexible portion connected to the central portion to be opposite to the first flexible portion and configured to be partially bent;
  a first sealing portion connected to the first flexible portion to be opposite to the central portion;
  a second sealing portion connected to the second flexible portion to be opposite to the central portion;
  a first extension portion connected to the first sealing portion to be opposite to the first flexible portion and configured to be partially bent; and
  a second extension portion connected to the second sealing portion to be opposite to the second flexible portion and configured to be partially bent,
wherein the FPCB is formed in a multi-layer structure in which a plurality of substrates having uneven surfaces according to metal patterns are stacked in a stacking direction,
wherein a stepped space by the uneven surfaces is formed between the plurality of substrates, and
wherein a ratio of an area of the stepped space to a length of the first sealing portion and the second sealing portion is less than or equal to a ratio of an area of the stepped space to a length of the first flexible portion and the second flexible portion.

17. The FPCB of claim 16, further comprising:
  a waterproof member disposed between the plurality of substrates to fill the stepped space,
wherein the waterproof member is positioned in the first sealing portion and the second sealing portion.

18. The FPCB of claim 17, wherein the waterproof member is omitted from the first flexible portion, the second flexible portion, the first extension portion, and the second extension portion.

19. The FPCB of claim 16, wherein in the first sealing portion and the second sealing portion, the metal patterns are formed to form a meander pattern in a state in which the stepped space is viewed in the stacking direction.

20. An electronic device, the electronic device comprising:
  a display comprising a first area and a second area;
  a first housing comprising a first surface on which the first area is disposed, and a second surface opposite to the first surface;
  a second housing comprising a third surface on which the second area is disposed, and a fourth surface opposite to the third surface;
  a hinge structure connecting the first housing and the second housing to be foldable about a folding axis and configured to change the first area and the second area between a first state of forming substantially the same plane and a second state of facing each other;
  a first bracket connecting the first housing and the hinge structure and comprising a first opening penetrating through a surface thereof;
  a second bracket connecting the second housing and the hinge structure and comprising a second opening penetrating through a surface thereof;

a first printed circuit board (PCB) disposed between the first bracket and the second surface;

a second PCB disposed between the second bracket and the fourth surface;

a flexible printed circuit board (FPCB) with at least a portion disposed between the hinge structure and the display, and both ends respectively connected to the first PCB and the second PCB by passing through the first opening and the second opening;

a first sealing member surrounding a perimeter of a first sealing portion of the FPCB positioned inside the first opening, and sealing between the first opening and the first sealing portion; and a second sealing member surrounding a perimeter of a second sealing portion of the FPCB positioned inside the second opening, and sealing between the second opening and the second sealing portion, wherein the FPCB is formed in a multi-layer structure in which a plurality of substrates having uneven surfaces according to metal patterns are stacked in a stacking direction, and wherein a waterproof member for filling a stepped space formed by the uneven surfaces between the plurality of substrates is disposed in the first sealing portion and the second sealing portion.

* * * * *